United States Patent
Kim et al.

(10) Patent No.: US 10,394,277 B2
(45) Date of Patent: Aug. 27, 2019

(54) ELECTRONIC DEVICE WITH MULTI-ANGLE CRADLING

(71) Applicant: Samsung Electronics Co., Ltd., Gyeonggi-do (KR)

(72) Inventors: Chung Ha Kim, Seoul (KR); Jangwoon Kim, Seoul (KR); Jaeho Baik, Gyeonggi-do (KR); Hyun Keun Son, Seoul (KR); Jun Won Lee, Gyeonggi-do (KR); Seung Ho Jang, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/983,230

(22) Filed: May 18, 2018

(65) Prior Publication Data

US 2018/0335800 A1   Nov. 22, 2018

(30) Foreign Application Priority Data

May 22, 2017   (KR) ........................ 10-2017-0062899

(51) Int. Cl.
*G06F 1/16* (2006.01)
*H05K 5/00* (2006.01)
*H05K 5/02* (2006.01)

(52) U.S. Cl.
CPC .......... *G06F 1/1618* (2013.01); *G06F 1/1675* (2013.01); *G06F 1/1679* (2013.01);
(Continued)

(58) Field of Classification Search
CPC .... G06F 1/1618; G06F 1/1675; G06F 1/1616; G06F 1/1681; G06F 1/1654; G06F 1/1679; H05K 5/0017; H05K 5/0217
See application file for complete search history.

(56) References Cited

U.S. PATENT DOCUMENTS

| | | |
|---|---|---|
| 10,050,378 B2 | 8/2018 | Szeto |
| 2010/0238620 A1 | 9/2010 | Fish |

(Continued)

FOREIGN PATENT DOCUMENTS

| | | |
|---|---|---|
| JP | 2016-48520 A | 4/2016 |
| KR | 10-2016-0028839 A | 3/2016 |
| KR | 10-2016-0083948 A | 7/2016 |

OTHER PUBLICATIONS

International Search Report dated Aug. 31, 2018.

*Primary Examiner* — Dimary Lopez Cruz
*Assistant Examiner* — Ingrid Wright
(74) *Attorney, Agent, or Firm* — Cha + Reiter, LLC.

(57) ABSTRACT

Disclosed herein is an electronic device that can be cradled at various angles using a magnetic force and a stopper structure. An electronic device according to various embodiments or the present disclosure may include: a first housing having a first cover disposed in a first direction and a second cover disposed in a second direction opposite the first direction; a second housing having a third cover disposed in a third direction and a fourth cover disposed in a fourth direction opposite the third direction; at least one first magnetic body forming a portion of the first housing; at least one second magnetic body forming a portion of the second housing, and configured to apply a force for maintaining a rotatably connected state of the second housing to the first housing using a magnetic force with the first magnetic body; a first sliding member forming a portion of the first housing, and a second sliding member forming a portion of the second housing to face the first sliding member such that the second housing is configured to be obliquely cradled to the first housing by being in contact with the first sliding member.

21 Claims, 31 Drawing Sheets

(52) U.S. Cl.
CPC ......... *H05K 5/0017* (2013.01); *H05K 5/0217* (2013.01); *G06F 1/1654* (2013.01)

(56) References Cited

U.S. PATENT DOCUMENTS

| | | | |
|---|---|---|---|
| 2013/0111704 A1* | 5/2013 | Mitsui | H04M 1/022 16/250 |
| 2014/0340840 A1* | 11/2014 | Han | G06F 1/1632 361/679.43 |
| 2016/0070303 A1 | 3/2016 | Lee et al. | |
| 2016/0111815 A1 | 4/2016 | Szeto et al. | |
| 2017/0012662 A1 | 1/2017 | Balaji et al. | |
| 2017/0017273 A1 | 1/2017 | Weldon et al. | |
| 2017/0220077 A1* | 8/2017 | Holung | G06F 1/1681 |

* cited by examiner

ELECTRONIC DEVICE WITH MULTI-ANGLE CRADLING

CROSS-REFERENCE TO RELATED APPLICATION(S)

This application is based on and claims priority under 35 U.S.C. § 119 to Korean Patent Application No. 10-2017-0062899, filed on May 22, 2017, in the Korean Intellectual Property Office, the disclosure of which is incorporated by reference herein in its entirety.

BACKGROUND

1) Field

Various embodiments disclosed herein relate to an electronic device that can be cradled at various angles using a magnetic force and a stopper structure.

2) Description of Related Art

The above information is presented as background information only to assist with an understanding of the present disclosure. No determination has been made, and no assertion is made, as to whether any of the above might be applicable as prior art with regard to the present disclosure.

In an electronic device including two housings (displays), when two housings are connected using magnetic bodies, the two housings are fixed simply using a magnetic force and are used at 0 degrees or 180 degrees.

SUMMARY

However, since the connection angles of the two housings are fixed, it is difficult to prepare for various user situations, and it is difficult to provide various user experiences. For example, a user may wish to use the first housing as a keyboard, and the second housing as the display. In such a situation, an angle between 120 and 150 degrees may be preferable.

Various embodiments are able to provide an electronic device capable of physically connecting two housings at various angles and maintaining a connected state using a magnetic force and a stopping structure.

An electronic device according to various embodiments or the present disclosure may include: a first housing having a first cover disposed in a first direction and a second cover disposed in a second direction opposite the first direction; a second housing having a third cover disposed in a third direction and a fourth cover disposed in a fourth direction opposite the third direction; at least one first magnetic body forming a portion of the first housing; at least one second magnetic body forming a portion of the second housing, and configured to apply a force for maintaining a rotatably connected state of the second housing to the first housing using a magnetic force with the first magnetic body; a first sliding member forming a portion of the first housing, and a second sliding member forming a portion of the second housing to face the first sliding member such that the second housing is configured to be obliquely cradled to the first housing by being in contact with the first sliding member.

An electronic device according to various embodiments of the present disclosure may include: a first housing having a first cover disposed in a first direction and a second cover disposed in a second direction opposite the first direction; a second housing having a third cover disposed in a third direction and a fourth cover disposed in a fourth direction opposite the third direction; one or more first magnetic bodies disposed along an edge portion of the first housing, one or more second magnetic bodies disposed along an edge portion of the second housing and configured to apply a force for maintaining a rotatably connected state of the second housing to the first housing using a magnetic force with the first magnetic bodies; a first sliding member mounted along the edge portion of the first housing and disposed such that at least a portion of the first sliding member is exposed to the outside at the edge portion of the first housing, and a second sliding member mounted along an edge portion of the second housing and disposed such that at least a portion of the second sliding member is exposed at the edge portion of the second housing and faces the first sliding member, wherein the second sliding member allows the second housing to be obliquely cradled to the first housing by being in contact with the first sliding member.

An electronic device according to various embodiments of the present disclosure is able to be cradled at various angles so as to provide various and convenient user experiences.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1A:
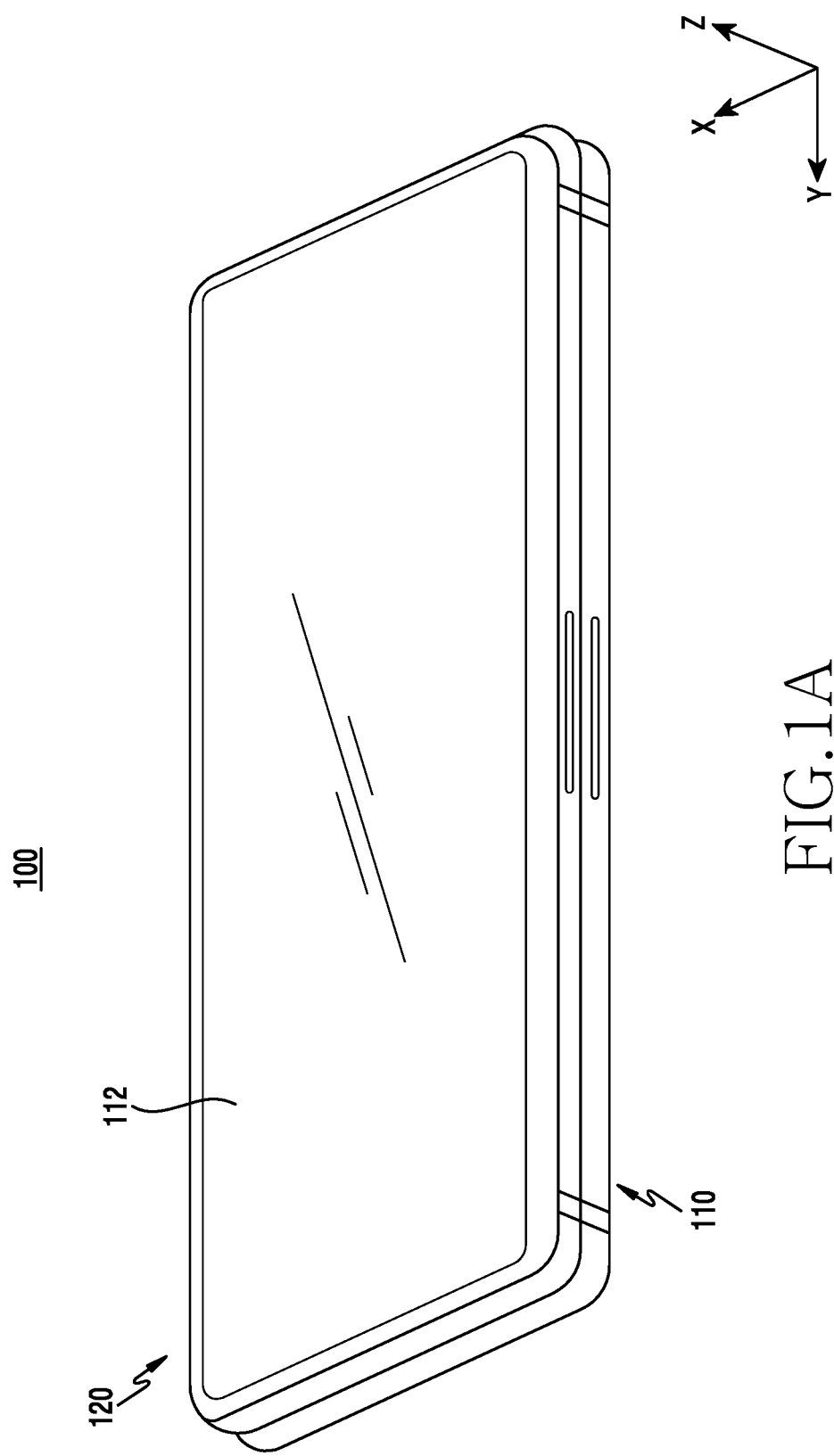
FIG. 1A is a perspective view illustrating an electronic device according to various embodiments of the present disclosure in a closed state (in-folded angle)

Hereinafter, various embodiments of the present invention will be described with reference to accompanying drawings. However, various embodiments of the present invention are not limited to specific embodiments, and it should be understood that modification, equivalent, and/or alternative on the various embodiments described herein can be variously made. With regard to description of drawings, similar components may be marked by similar reference numerals.

An electronic device according to various embodiments of the present disclosure may include at least one of smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, or wearable devices (for example, smart glasses, head-mounted-devices (HMDs), electronic apparels, electronic bracelets, electronic necklaces, electronic accessory, electronic tattoos, smart mirrors, or smart watches).

According to certain embodiments, the electronic devices may be smart home appliances. The smart home appliances may include at least one of, for example, televisions (TVs), digital video disk (DVD) players, audios, refrigerators, air conditioners, cleaners, ovens, microwave ovens, washing machines, air cleaners, set-top boxes, home automation control panels, security control panels, TV boxes (for example, Samsung HomeSync™ Apple TV™, or Google TV™), game consoles (for example, Xbox™ and PlayStation™) electronic dictionaries, electronic keys, camcorders, electronic picture frames, and the like.

According to another embodiment, the electronic devices may include at least one of medical devices (for example, various portable medical measurement devices (for example, a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation electronic devices, global positioning system receivers (GPSs), event data recorders (EDRs), flight data recorders (FDRs), vehicle infotainment devices, electronic equipment for vessels (for example, navigation systems and gyrocompasses), avionics, security devices, head units for vehicles, industrial or home robots, automatic teller's machines (ATMs) of financial institutions, points of sales (POSs) of stores, or internet of things (for example, light bulbs, various sensors, electric or gas meters, sprinkler devices, fire alarms, thermostats, street lamps, toasters, exercise equipment, hot water tanks, heaters, boilers, and the like).

According to a certain embodiment, the electronic devices may include at least one of a part of furniture or buildings/structures, electronic boards, electronic signature receiving devices, projectors, or various measuring instruments (for example, water meters, electricity meters, gas meters, or wave meters, and the like). The electronic devices according to various embodiments may be one or more combinations of the above-mentioned devices. According to a certain embodiment, an electronic device may be a flexible electronic device. Also, electronic devices according to various embodiments of the present disclosure are not limited to the above-mentioned devices, and may include new electronic devices according to technology development.

Figure 1B:
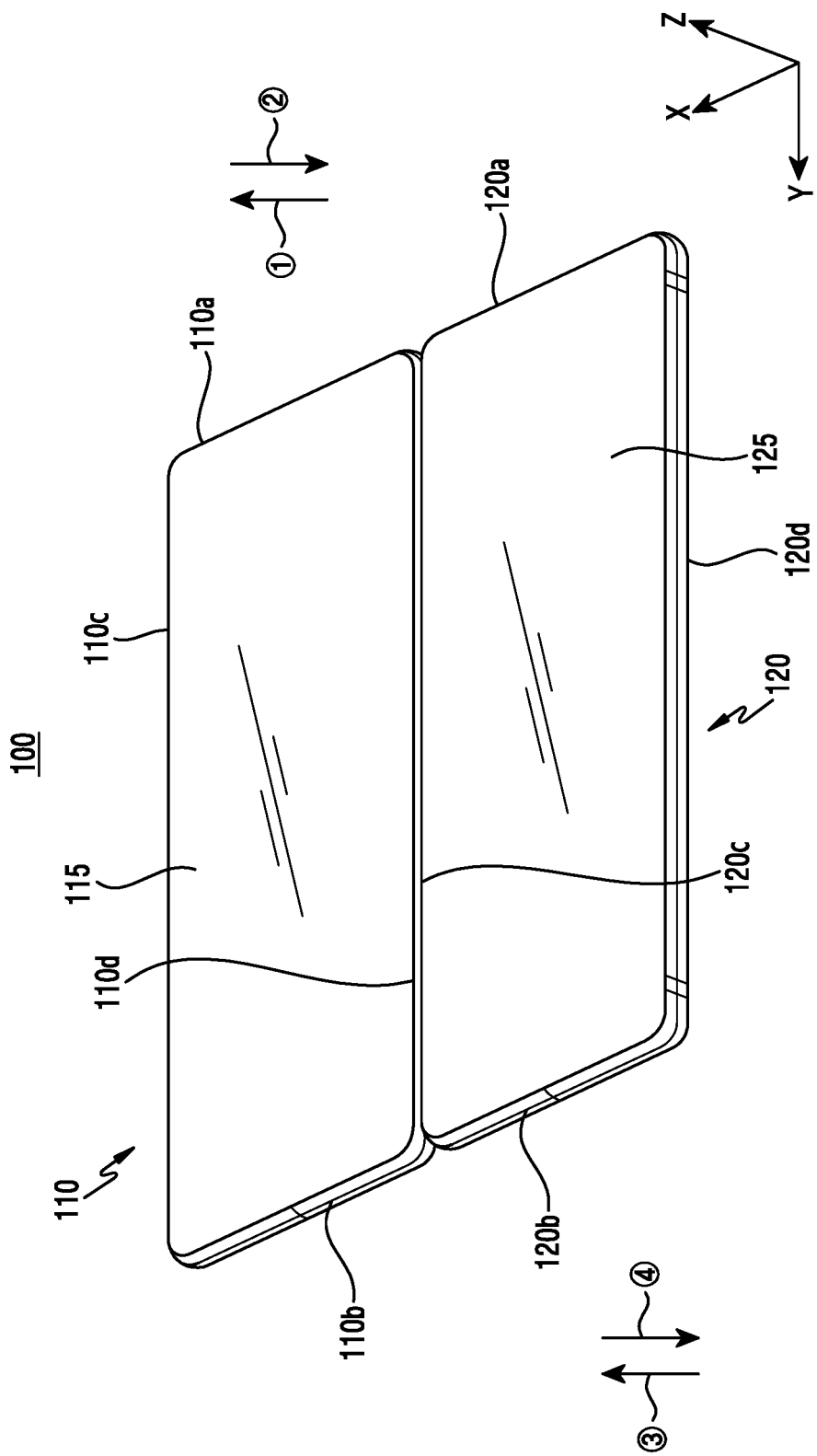
FIG. 1B is a perspective view illustrating the electronic device according to various embodiments of the present disclosure in an opened state (open angle)
Figure 1C:
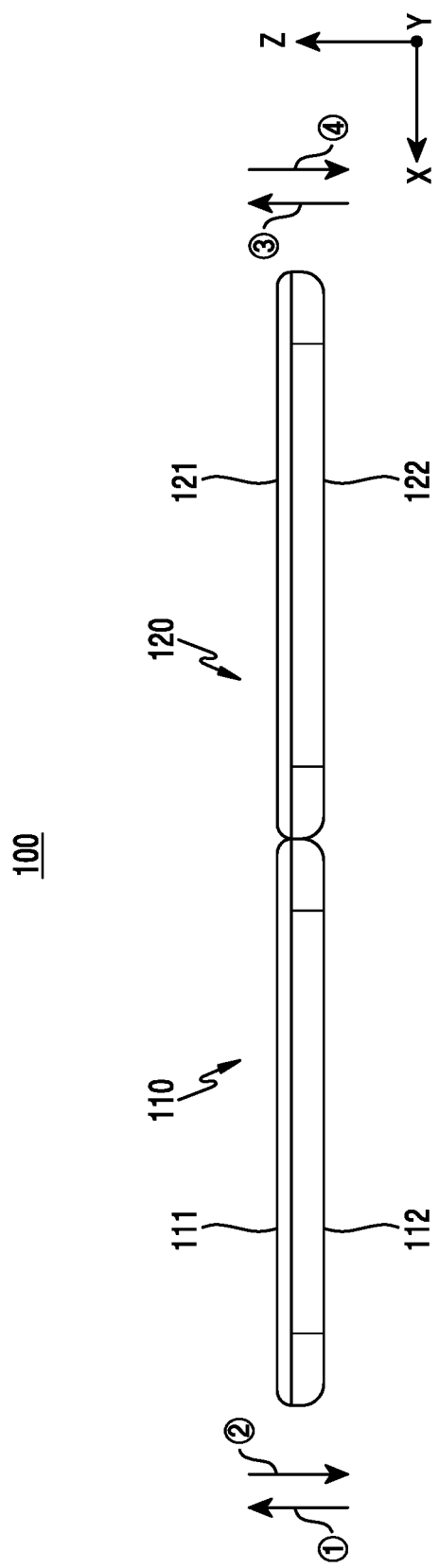
FIG. 1C is a front view illustrating the electronic device according to various embodiments in the opened state (open angle)

Referring to FIGS. 1A to 1C, an electronic device 100 according to various embodiments may include a first housing 110, a second housing 120, connected to each other by at least one magnetic body forming a portion of the first housing and at least one second magnetic body forming a portion of the second housing and configured to apply a force for maintain a rotatably connected state of the second housing to the first housing using magnetic force with the first body. For example, the first housing 110 may be an electronic device, and the second housing 120 may be another electronic device. The first housing 110 may also be referred to as a first body, a first body housing, and a first functional device. The second housing 120 may be a device independent of the first housing 110 and may also be referred to as a second body, a second body housing, and a second functional device. Each of the first and second housings 110 and 120 is independently operable and the first and second housings 110 and 120 may be configured to communicate with each other wirelessly.

The electronic device 100 according to various embodiments may be configured to be capable of being cradled at various angles. For example, the electronic device 100 may be cradled with a folded angle (closed angle), an out-folded angle, an un-folded angle (open angle), an inclined cradling angle, etc. as an embodiment of various angles.

The electronic device 100 according to various embodiments may connect the first and second housings 110 and 120 using the magnetic force of one or more magnetic bodies and may provide a holding force at various angles. The magnetic bodies may be mounted on or integrated with the first and second housings. For purposes of this document, "forming a portion of" shall include both mounted on or integrated with.

The first housing 110 according to various embodiments may have a first cover disposed in a first direction ①, and a second cover disposed in a second direction ② directed in a direction opposite the first direction. For example, the first cover may also be referred to as a first plate, a first face, a front face, or a front cover. The second cover may also be referred to as a second plate, a second face, a rear face, or a back cover. The first direction ① may be an upward direction, and the second direction ② may be a downward direction. The first housing 110 has a first side face between the first and second covers, and an accommodation space may be located by being surrounded by the first side face. A first display 115 may be disposed in the accommodation space.

In the first housing 110 according to various embodiments, the first display 115 may be disposed such that a screen displayed to be exposed to the first cover is visible. The first display 115 may be located between the first and second covers. The first display 115 according to various embodiments may include a window and a display module, or may include a window, a display module, and a touch screen panel.

The first display 115 according to various embodiments may be configured in a portion or a greater portion of the first cover of the first housing 110. For example, when the first display 115 is disposed in the greater portion of the first cover of the first housing 110, the first display 115 may be referred to as a full display screen.

The first display 115 according to various embodiments may display shortcut icons, a main menu switch key, time, weather, and the like for executing frequently used applications. The main menu switch key may cause a menu screen to be displayed on the first display 115. In addition, a status bar may be displayed at the upper end of the first display 115 in order to indicate the state of the electronic device such as the battery charging status, the intensity of a received signal, and the current time.

Although not illustrated in the figure, a first camera, an illuminance sensor, and a proximity sensor may be disposed at an edge of the first housing 110. A second camera, a flash, and a speaker may be disposed on the second cover of the first housing 110.

For example, a power/reset button, a volume button, a terrestrial DMB antenna for receiving broadcasting, one or more microphones, etc. may be disposed on a side face of the first housing 110 according to various embodiments. The DMB antenna may be fixed to the electronic device 100 or may be detachably formed. In addition, a connector (not illustrated) may be mounted on the lower end side surface of the first housing 110. The connector may be formed with a plurality of electrodes, and may be connected to an external device via a wire. An earphone connecting jack (not illustrated) may be disposed on the upper end side face of the flexible device 110. An earphone may be inserted into the earphone connecting jack. The earphone connecting jack may be disposed on the lower end side face of the first housing 110.

The first housing 110 according to various embodiments is approximately rectangular when viewed from above, and may include four sides and four edge portions. For example, the first housing 110 may include first and second edge portions 110a and 110b and third and fourth edge portions 110c and 110d between the first and second edge portions 110a and 110b. The first and second edge portions 110a and 110b may be upper and lower edge portions, respectively, and the third and fourth edge portions 110c and 110d may be left and right edge portions, respectively.

The second housing 120 according to various embodiments may be configured at least partially or wholly the same as the first housing 110. The second housing 120 according to various embodiments may have a third cover disposed in a third direction ③, and a fourth cover disposed in a fourth direction ④ directed opposite the third direction. For example, the third cover may also be referred to as a third plate, a third face, a front face, or a front cover. The fourth cover may also be referred to as a fourth plate, a fourth face, a rear face, or a back cover. The third direction ③ may be the upward direction, and the fourth direction ④ may be the downward direction. In the open angle, first direction ① and third direction ③ may be the same and the second direction ② and the fourth direction ④ may be the same. The second housing 120 has a second side face between the third and fourth covers, and an accommodating space may be located by being surrounded by the second side face. A second display 125 may be disposed in the accommodation space.

In the first housing 120 according to various embodiments, the second display 125 may be disposed such that a screen displayed on the third cover is visible. The first display 125 may be located between the third and fourth covers. At least a part or the entirety of the second display 125 according to various embodiments may be configured to be the same as the first display 115.

The second housing 120 according to various embodiments is approximately rectangular when viewed from above, and may include four sides and four edge portions. For example, the second housing 120 may include first and second edge portions 120a and 120b and third and fourth edge portions 120c and 120d between the first and second edge portions 120a and 120b. The first and second edge portions 120a and 120b may be upper and lower edge portions, respectively, and the third and fourth edge portions 120c and 120d may be left and right edge portions, respectively.

Referring to FIGS. 2A to 3D, in the electronic device according to various embodiments, the first and second housings, which are independent from each other, may be connected to each other as a single body using a magnetic force. For example, the electronic device may be configured to be cradled at various angles using a magnetic force. As various angular embodiments, the electronic device may be cradled at a folding angle (closed angle), an out-folded angle, an un-folded angle (open angle), an inclined cradling angle, and the like.

Figure 2A:
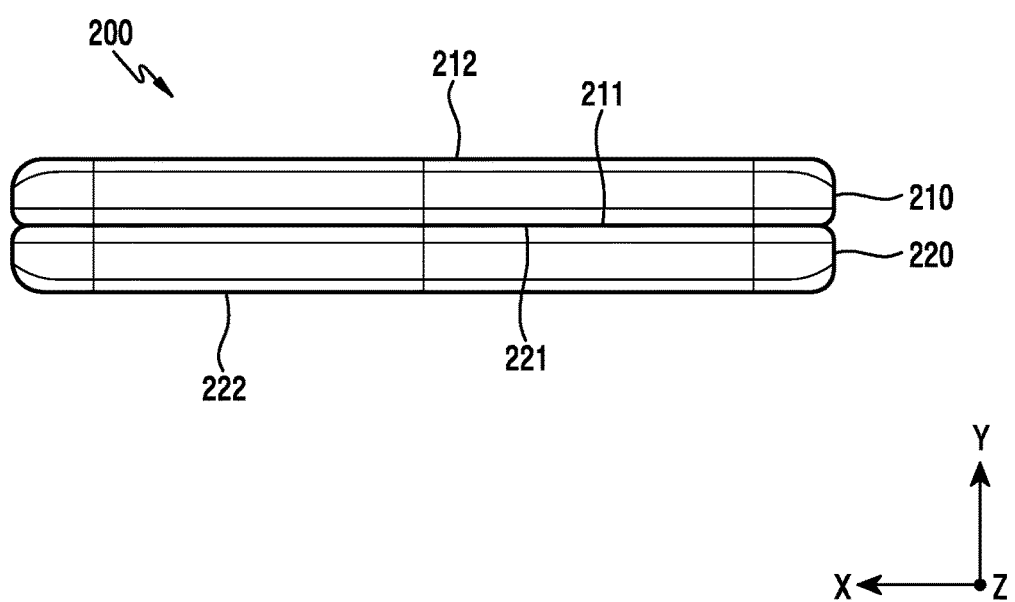
FIG. 2A is a front view illustrating the electronic device according to various embodiments of the present disclosure at an in-folded angle.

Referring to FIG. 2A, an electronic device 200 according to various embodiments may be at least partially or wholly the same as the electronic device 100 illustrated in FIGS. 1A to 1C. The electronic device 200 according to various embodiments may be configured such that the first and second housings 210 and 220 are disposed in a folded state at an in-folded angle, the first cover 211 of the first housing 210 may face the third cover 221 of the second housing 220, and the second cover 212 of the first housing 210 may be opposed to the fourth cover 222 of the second housing 220.

Figure 2B:
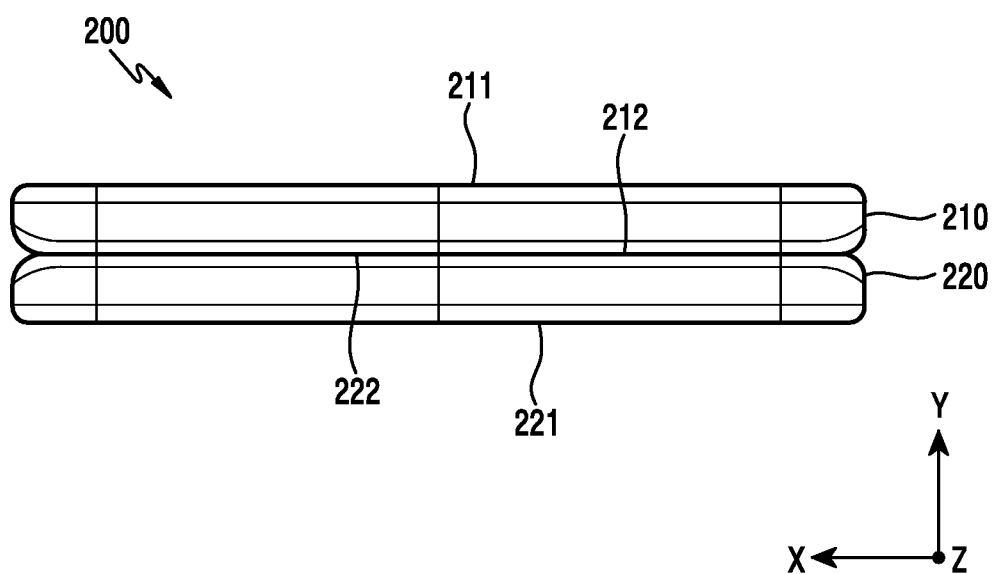
FIG. 2B is a front view illustrating the electronic device according to various embodiments of the present disclosure at an out-folded angle.

Referring to FIG. 2B, the electronic device 200 according to various embodiments may be configured such that the first and second housings 210 and 220 are disposed in a folded state at an out-folded angle, the second cover 212 of the first housing 210 may face the fourth cover 222 of the second housing 220, and the first cover 211 of the first housing 210 may be opposed to the third cover 221 of the second housing 220.

Figure 3A:
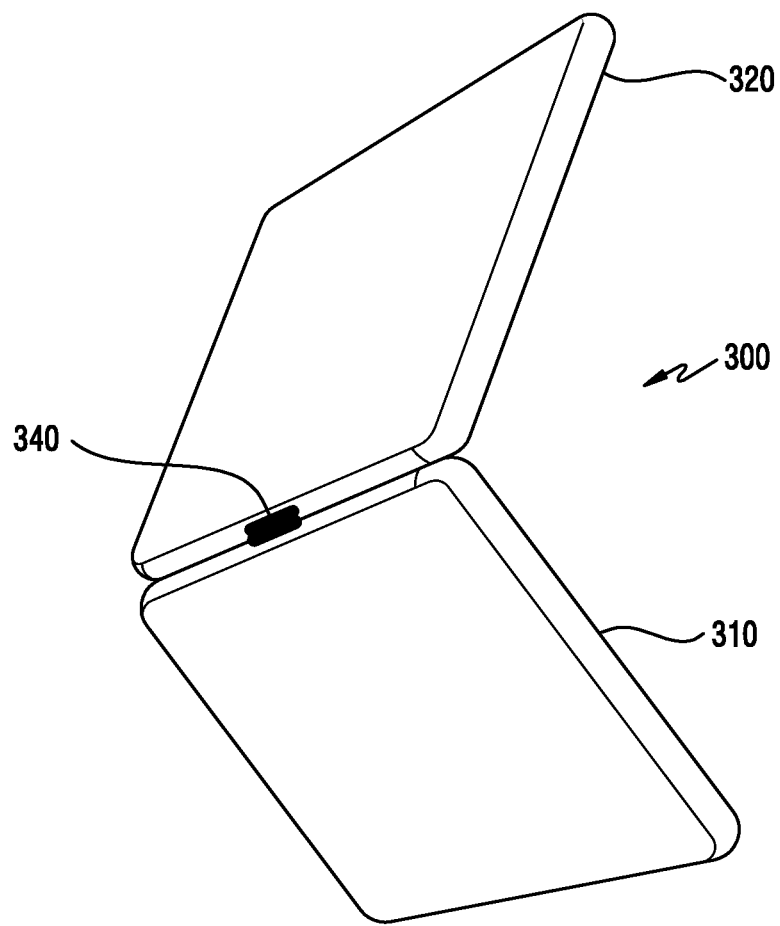
FIG. 3A is a perspective view illustrating the electronic device according to various embodiments of the present disclosure at a first cradling angle in an inclined state.
Figure 3B:
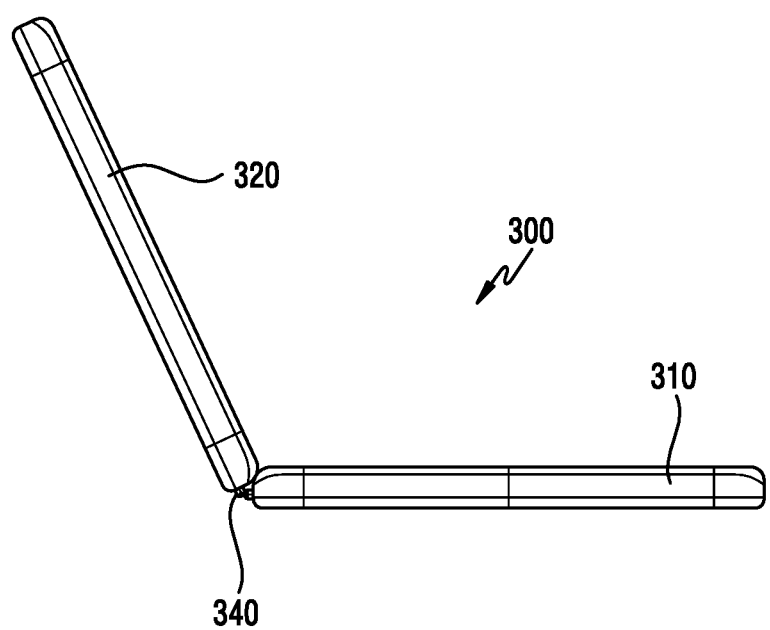
FIG. 3B is a front view thereof.

Referring to FIGS. 3A and 3B, an electronic device 300 according to various embodiments may be at least partially or wholly the same as the electronic device 100 illustrated in FIGS. 1A to 1C. The electronic device 300 according to various embodiments may be obliquely supported by the second housing 320 at an angle between approximately 100 and 120 degrees with respect to the first housing 310 and may be maintained in the supported state. As described later, the second housing 320 may be kept inclined to the first housing 310 by the magnetic force of the magnetic bodies and the stopping device 340 serving as a stopper.

Figure 3C:
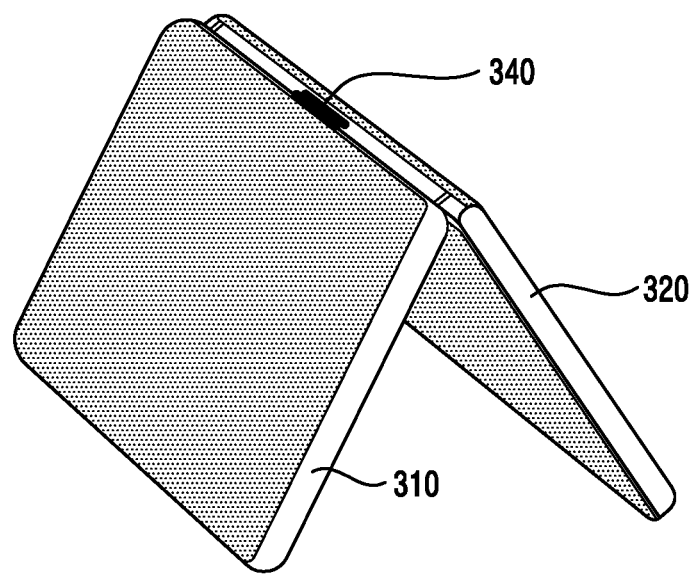
FIG. 3C is a perspective view illustrating the electronic device according to various embodiments of the present disclosure at the first cradling angle in the inclined state.
Figure 3D:
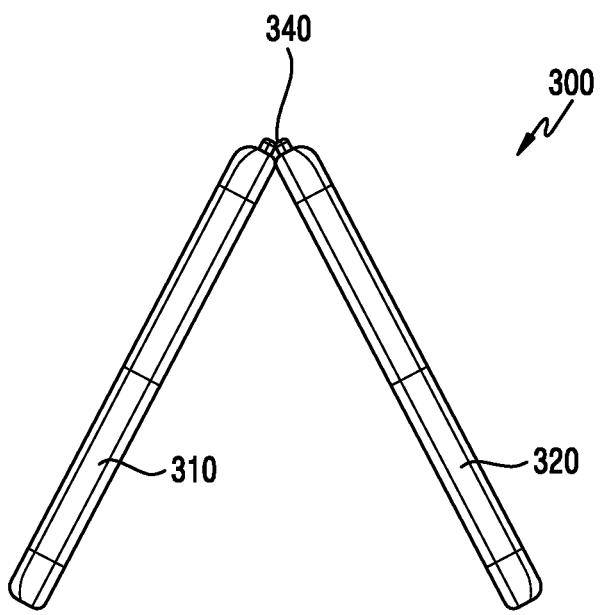
FIG. 3D is a front view thereof.

Referring to FIG. 3C, the electronic device 300 according to various embodiments may be obliquely supported by the second housing 320 at an angle between approximately 45 and 75 degrees with respect to the first housing 310 and may be maintained in the supported state. As described later, the second housing 320 may be kept inclined to the first housing 310 by the magnetic force of the magnetic bodies and the stopping device 340 serving as a stopper.

Figure 4:
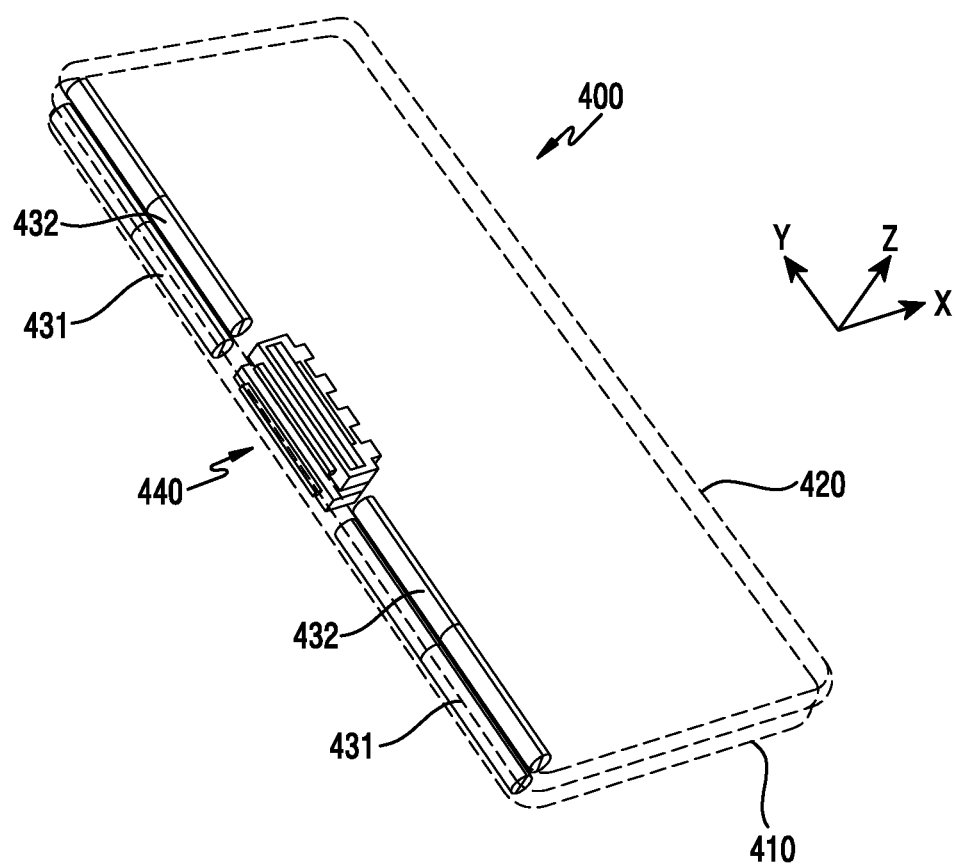
FIG. 4 is a perspective view illustrating magnetic bodies and a stopping device mounted in the electronic device according to various embodiments of the present disclosure.

Referring to FIG. 4, a connecting device according to various embodiments may be a connecting device of an electronic device which is at least partially or wholly the same as the electronic device 100 illustrated in FIGS. 1A to 1C. The connecting device according to various embodiments may include a first magnetic body 431 mounted on the first housing 410 and a second magnetic body 432 mounted on the second housing 420. For example, an attraction or repulsive force may act between the first and second magnetic bodies 431 and 432, and an attraction force may act between the first and second magnetic bodies 431 and 432 according to the present disclosure.

The first housing 410 according to various embodiments may have a first edge portion (see FIG. 1C) located at each rim. For example, the first magnetic body 431 may be disposed along one of the first edge portions of the first housing 410. A plurality of first magnetic bodies 431 may be disposed along the first edge portion of the first housing 410, and the first magnetic bodies 431 may be disposed at regular intervals. The first magnetic bodies 431 may be accommodated in the first edge portion of the first housing 410. The first magnetic bodies 431 may have a cylindrical shape, but are not limited thereto. For example, the first magnetic bodies 431 may have a polygonal columnar shape such as a square column or a pentagonal column. For example, each first magnetic body 431 may be configured to include an N pole and an S pole.

The second housing 420 according to various embodiments may have a second edge portion located at each rim. For example, the second magnetic body 432 may be disposed along one of the second edge portions of the second housing 420. A plurality of second magnetic bodies 432 may be disposed along the second edge portion of the second housing 420, and the second magnetic bodies 431 may be disposed at regular intervals. The second magnetic bodies 432 may be accommodated in the second edge portion of the second housing 420. The second magnetic bodies may have a cylindrical shape, but are not limited thereto. For example, the second magnetic bodies 431 may have a polygonal columnar shape such as a square column or a pentagonal column. For example, each second magnetic body may be configured to include an N pole and an S pole.

The electronic device 400 according to various embodiments may be configured to provide a force for maintaining the connected state of the first and second housings 410 and 420 at various angles such as an in-folded angle (closed angle), an out-folded angle, and an open angle using the attractive force between first and second magnetic bodies 431 and 432.

Referring to FIGS. 5A to 5D, the disposal of magnetic bodies according to various cradling angles will be described. An electronic device 500 according to various embodiments may be at least partially or wholly the same as the electronic device 100 illustrated in FIGS. 1A to 1C. The electronic device 500 according to various embodiments includes two independent first and second housings 510 and 520, the connected state of which may be maintained using a magnetic force.

Figure 5A:
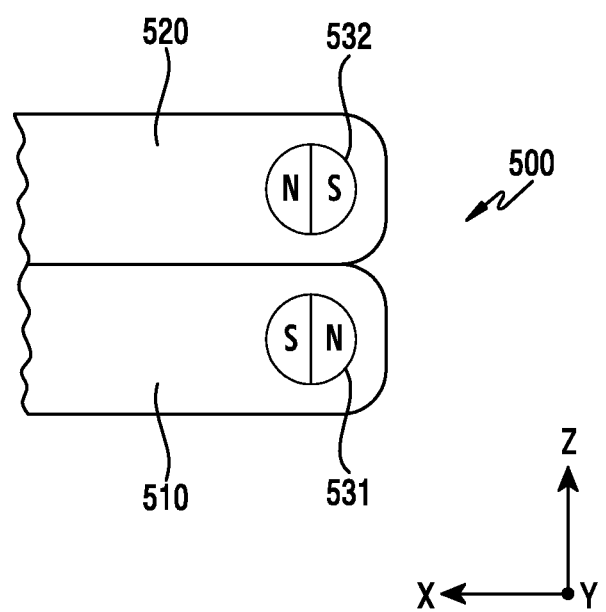
FIG. 5A, FIG. 5B, FIG. 5C and FIG. 5D are side views representing the states of respective magnetic bodies at various mounting angles of an electronic device according to various embodiments of the present disclosure, respectively.

Referring to FIG. 5A, when the electronic device 500 according to various embodiments is in the in-folded angle, the first housing 510 and the second housing 520 may be disposed to overlap each other, and the first and second magnetic bodies 531 and 532 may be disposed such that an attractive force acts therebetween. The magnetic force may be at least a part of the force capable of maintaining the first housing 510 and the second housing 520 in the overlapped state. The N pole of the first magnetic body 531 may be disposed close to the S pole of the second magnetic body 532 and the S pole of the first magnetic body 531 may be disposed close to the N pole of the second magnetic body 532.

Figure 5B:
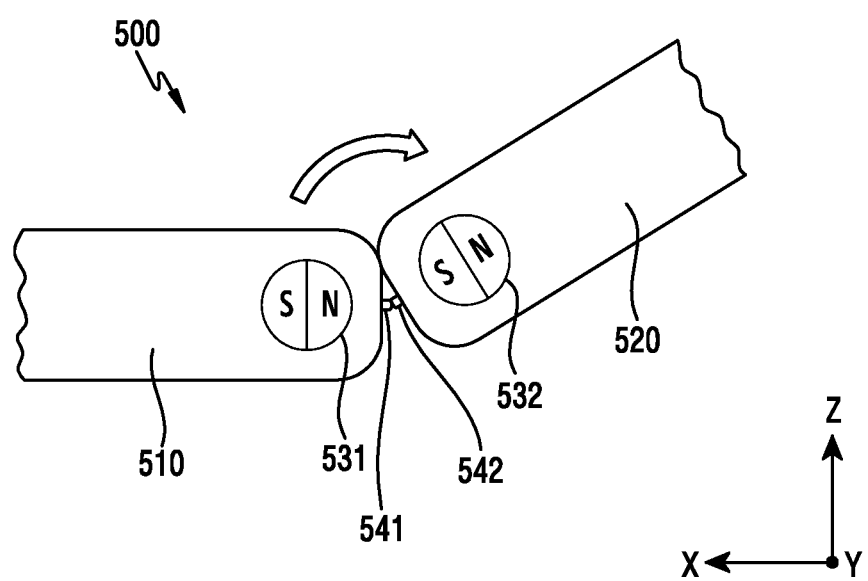

Referring to FIG. 5B, when the second housing 520 of the electronic device 500 according to various embodiments is in the cradling angle where the second housing 520 is obliquely cradled, the first housing 510 and the second housing 520 may be obliquely disposed with respect to each other, and the first magnetic body 531 and the second magnetic body 532 may be disposed closed to each other, so that an attractive force may act therebetween. By the magnetic force, the first housing 510 and the second housing 520 may be maintained in the rotably connected state, wherein the N pole of magnet 531 and the S pole of magnet 532 cause ends of first housing 510 and second housing 520 to make contact. The N pole of the first magnetic body 531 may be disposed close to the S pole of the second magnetic body 532 and the S pole of the first magnetic body 531 may be disposed remote from the N pole of the second magnetic body 532, so that the second housing 520 can rotate about first housing 510. A contact structure between a first protrusion 541 provided on the first housing 510 and a second protrusion 542 provided on the second housing 520 functions as a stopper, so that the second housing 520 can be stopped in an inclined state with respect to the housing 510.

Figure 5C:
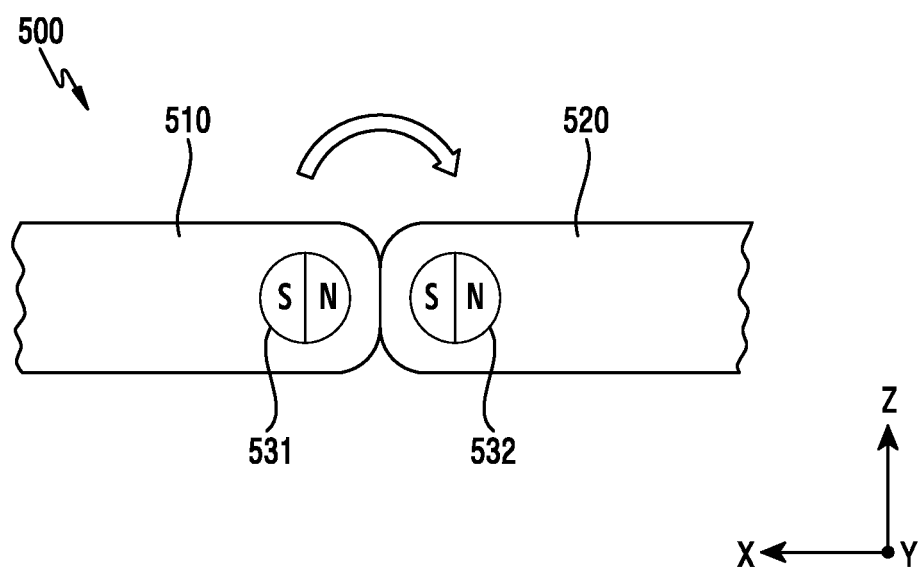

Referring to FIG. 5C, when the electronic device 500 according to various embodiments is in the open angle (un-folded angle), the first housing 510 and the second housing 520 are disposed co-planar to each other without being overlapped, and the first and second magnetic bodies 531 and 532 may be disposed such that an attractive force acts therebetween. By the magnetic force, the first housing 510 and the second housing 520 may be maintained in the co-planar state without being overlapped. The N pole of the first magnetic body 531 may be disposed close to the S pole of the second magnetic body 532 and the S pole of the first magnetic body 531 may be disposed remote from the N pole of the second magnetic body 532.

Figure 5D:
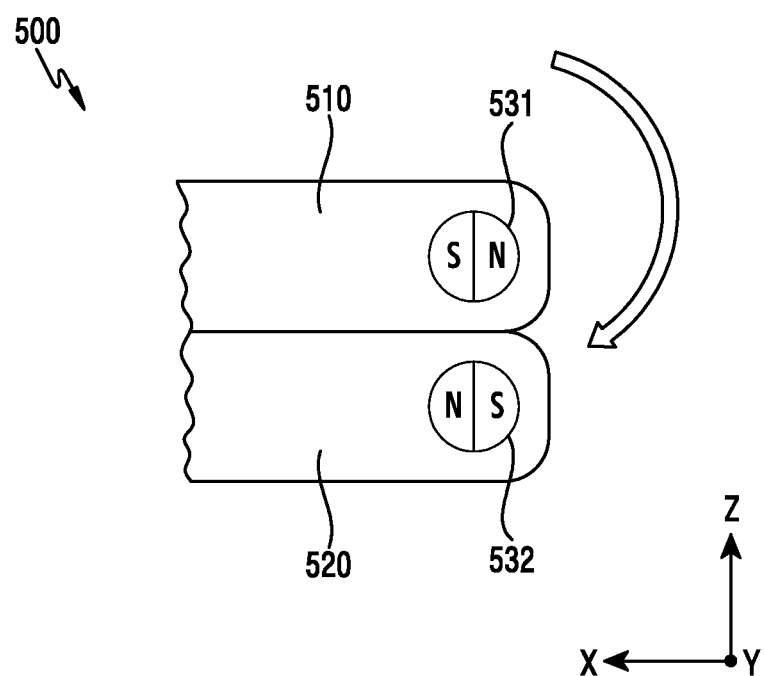

Referring to FIG. 5D, when the electronic device 500 according to various embodiments is in the out-folded angle, the first housing 510 and the second housing 520 may be disposed to overlap each other, and the first and second magnetic bodies 531 and 532 may be disposed such that an attractive force acts therebetween. By the magnetic force, the first housing 510 and the second housing 520 may be maintained in the overlapped state. The N pole of the first magnetic body 531 may be disposed close to the S pole of the second magnetic body 532 and the S pole of the first magnetic body 531 may be disposed close to the N pole of the second magnetic body 532.

Figure 6A:
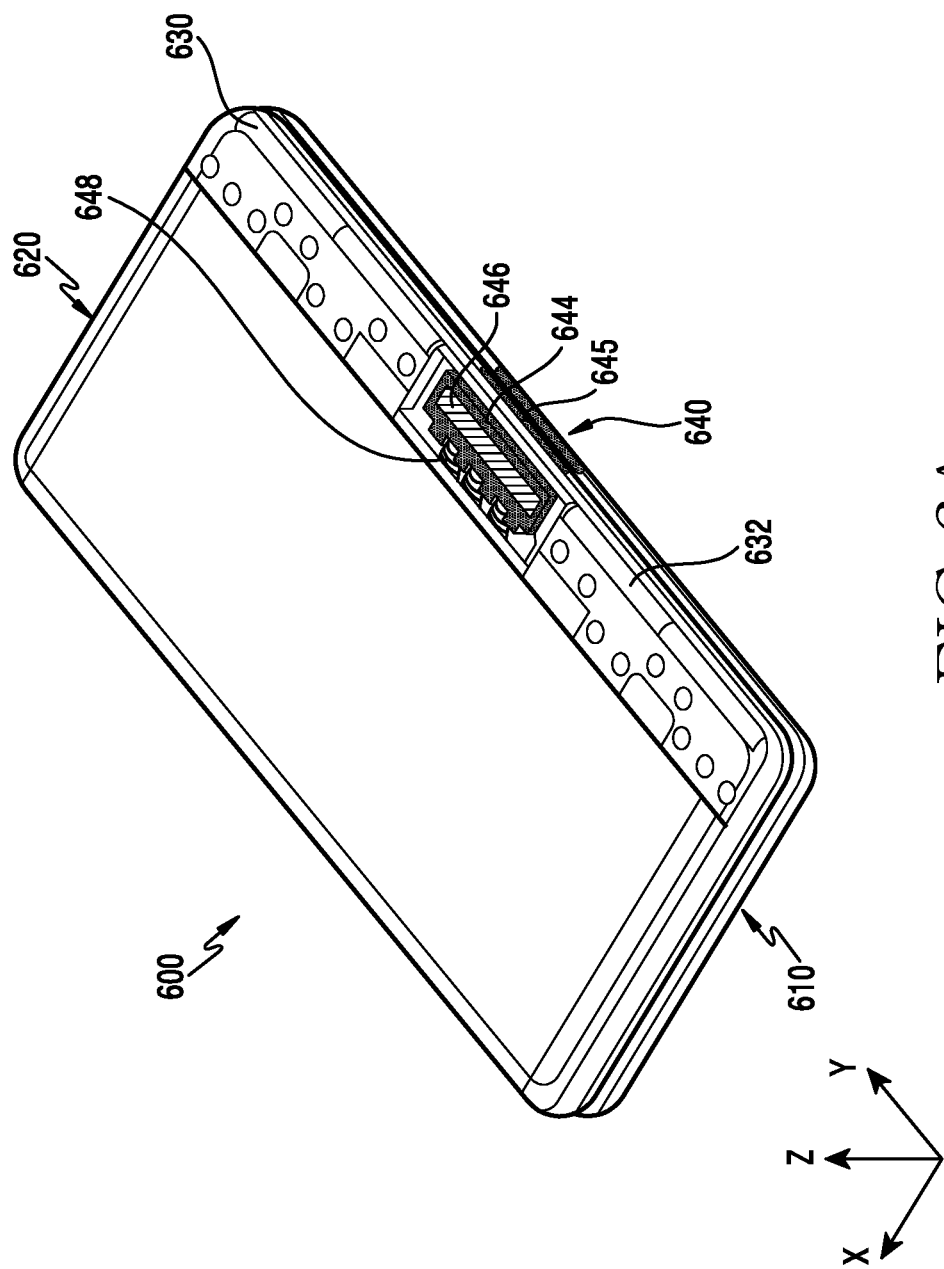
FIG. 6A is a perspective view illustrating a portion of a disposed state of a connecting device and a stopping device mounted on the electronic device according to various embodiments of the present disclosure.
Figure 6B:
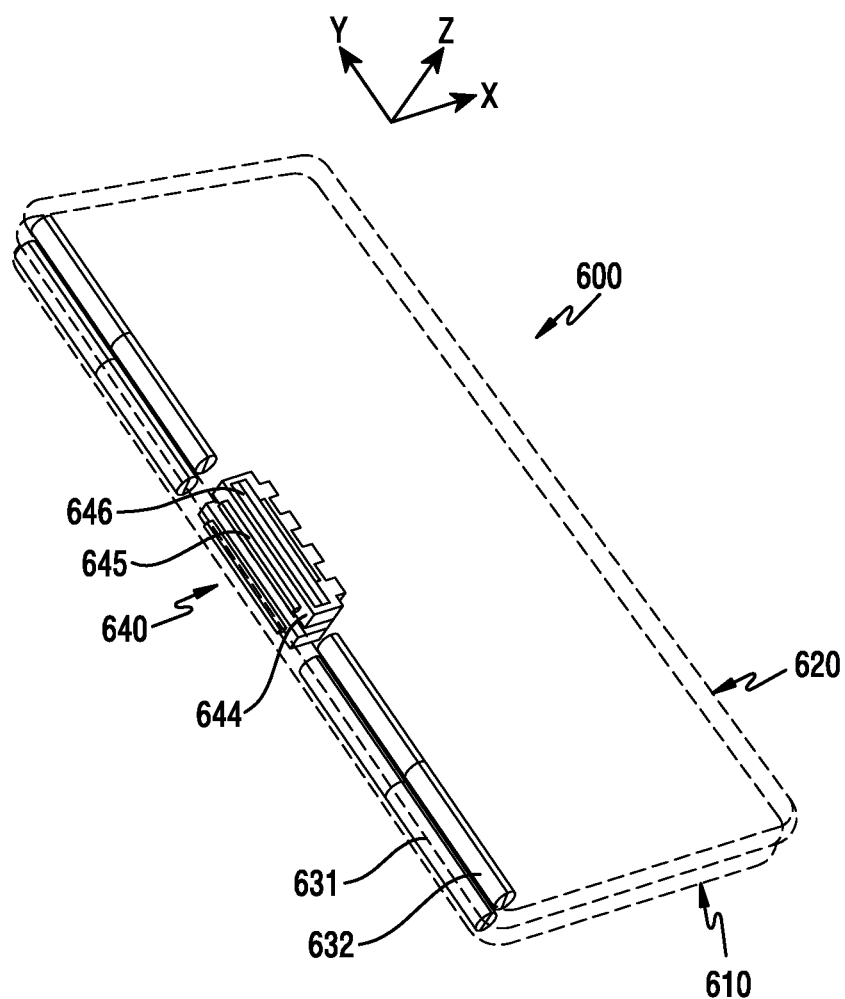
FIG. 6B is a perspective view illustrating the connecting device and the stopping device mounted on the electronic device according to various embodiments.
Figure 6C:
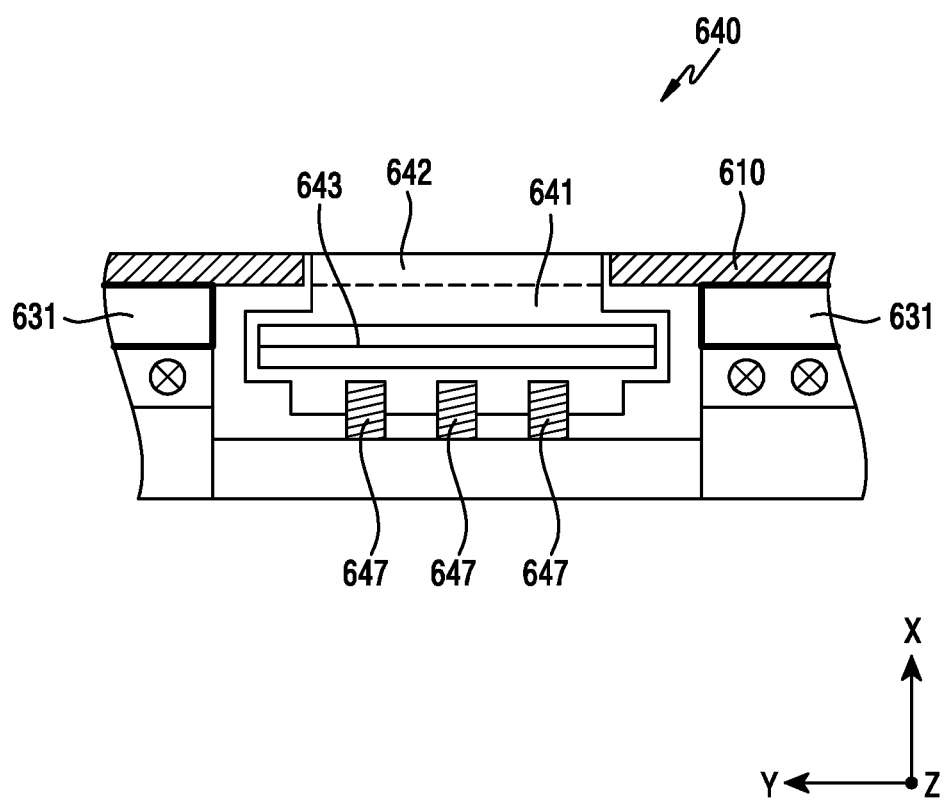
FIG. 6C is a plan view illustrating the connecting device mounted on the electronic device according to various embodiments of the present disclosure in a partially cutaway state.

Referring to FIGS. 6A to 6C, an electronic device 600 according to various embodiments may be at least partially or wholly the same as the electronic device 100 illustrated in FIGS. 1A to 1C. The electronic device 600 according to various embodiments may include a device 640 that acts as a stopper to maintain the inclined and cradled state of the second housing 620 when the second housing 620 is obliquely cradled to the first housing 610. Hereinafter, such a device 640 will be referred to as a stopping device.

The stopping device 640 according to various embodiments may include a first sliding member 641 mounted on or integrated with the first housing 610 and a second sliding member 644 mounted on or integrated with the second housing 620. Each of the first and second sliding members 641 and 644 is made of a metal material (e.g., an SUS material), so that an attractive force can act with the magnetic body.

The first sliding member 641 according to various embodiments is disposed in parallel between the first and second covers of the first housing 610 so as to perform a sliding back and forth movement while maintaining a state parallel to the first and second covers. The second sliding member 644 according to various embodiments is disposed in parallel between the third and fourth covers of the second housing 620 so as to perform a sliding back and forth movement while maintaining a state parallel to the third and fourth covers.

According to various embodiments, the first housing 610 may include a first sliding member 641 between the first magnetic bodies 631. According to various embodiments, the second housing 620 may include a second sliding member 644 between the second magnetic bodies 632. The first and second sliding members 641 and 644 may face each other and may be disposed at corresponding positions.

In the electronic device 600 according to various embodiments, when the second housing 620 is obliquely cradled to the first housing 610, the second housing 620 can be stopped with respect to the first housing 610 by the contact between the first and second sliding members 641 and 644. The second housing 620 may be obliquely connected to the first housing 610 by the magnetic force between the first and second magnetic bodies 631 and 632 described above. This connection force can be provided by the attractive force between the first and second magnetic bodies 631 and 632 and the contact between the first and second sliding members 641 and 644.

According to various embodiments, the first sliding member 641 includes a third magnetic body 643 and the second sliding member 644 further includes a fourth magnetic body 646 facing the third magnetic body 643, so that the in-folded state or the out-folded state of the first and second housings 610 and 620 can be maintained by the attractive force between the third and fourth magnetic bodies 643 and 646.

According to various embodiments, the first sliding member 641 includes a first protrusion 642, which is made of a metal material such as an SUS material, and the first protrusion 642 may be disposed to be exposed to at least a portion of the side face of a first edge portion of the first housing 610. According to various embodiments, the second sliding member 644 includes a second protrusion 645, which is made of a metal material, and the second protrusion 645 may be disposed to be exposed to at least a portion of the side face of a second edge portion of the second housing 620.

In the electronic device 600 according to various embodiments, when the second housing 620 is obliquely cradled to the first housing 610, the second housing 620 can be stopped without moving with respect to the first housing 610 by the contact between the first and second protrusions 642 and 645. When the second housing 620 is obliquely cradled to the first housing 610, the first protrusion 642 protrudes from the first housing 610 and comes into contact with the second protrusion 645, and the second protrusion 645 protrudes from the second housing 620 and comes into contact with the first protrusion 642, so that the first and second protrusions 642 and 645 can serve as stoppers for the second housing 620.

According to various embodiments, the first sliding member 641 may be supported by at least one first elastic body 647 to move toward the inside of the first housing 610 and the second sliding member 644 may be supported by at least one second elastic body 648 to move toward the inside of the second housing 620.

When the second housing 620 is in the in-folded or out-folded angle with respect to the first housing 610, the first protrusion 642 may be disposed so as not to come into contact with the second protrusion 645 by the first elastic body 647 and to be accommodated in the first housing 610 without protruding, and the second protrusion 645 may be disposed so as not to come into contact with the first protrusion 642 by the second elastic body 648 and to be accommodated in the second housing 620 without protruding.

Figure 7A:
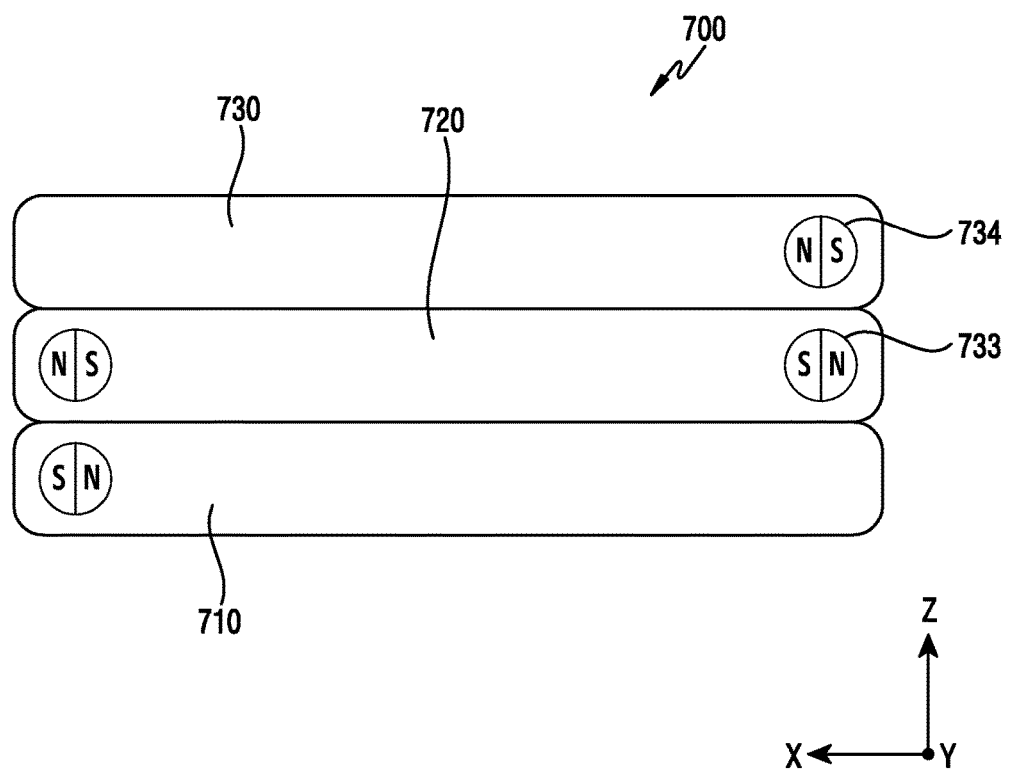
FIG. 7A is a side view illustrating an electronic device according to another embodiment of the present disclosure in the closed state (in-folded angle)

Referring to FIG. 7A, an electronic device 700 according to various embodiments has some components which are the same as those of the electronic device 500 illustrated in FIGS. 5A to 5D. Thus, descriptions of the same components will be omitted in order to avoid redundant description, and only the difference therebetween will be described.

The electronic device 700 according to various embodiments may include three housings, i.e. first, second, and third housings 710, 720, and 730, first and second stopping devices, and first and second connecting devices. Descriptions of the configurations of the first and second housings 710 and 720, the first connecting device, and the first stopping device of the electronic device according to various embodiments will be omitted because they are described in detail with reference to FIGS. 1 to 6.

In the electronic device 700 according to various embodiments, the third housing 730 may be connected to the second housing 720 by the second connecting device. The second connecting device may be configured to be the same as the first connecting device that connects the first and second housings 710 and 720 to each other. The second connecting device may include third and third magnetic bodies 733 and 734 and a second stopping device (not illustrated). The second stopping device may be configured to be the same as the first stopping device 640 illustrated in FIGS. 6A to 6C.

Figure 7B:
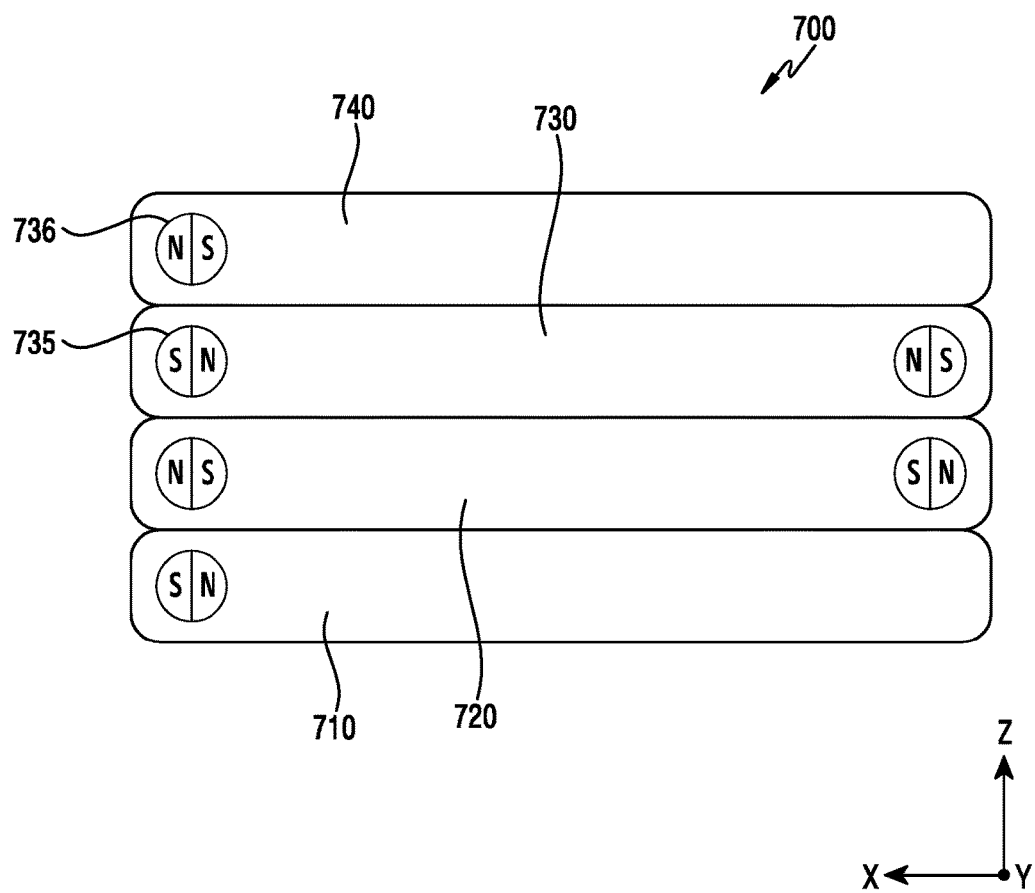
FIG. 7B is a side view illustrating an electronic device according to still another embodiment of the present disclosure in the closed state (in-folded angle)

Referring to FIG. 7B, an electronic device 700 according to various embodiments has some components which are the same as those of the electronic device illustrated in FIG. 7A. Thus, descriptions of the same components will be omitted in order to avoid redundant description, and only the difference therebetween will be described.

The electronic device 700 according to various embodiments may include four housings, i.e. first, second, third, and fourth housings 710, 720, 730, and 740, first, second, and third stopping devices, and first, second, and third connecting devices. Descriptions of the configurations of the first, second, and third housings, the first, second, and third connecting devices, and the first and second stopping devices of the electronic device 700 according to various embodiments will be omitted because they are described in detail with reference to FIG. 7A.

In the electronic device 700 according to various embodiments, the fourth housing 740 may be connected to the third housing 730 by the third connecting device. The third connecting device may be configured to be the same as the first connecting device that connects the first and second housings 710 and 720 to each other and the second connecting device that connects the second and third housings 720 and 730 to each other. The third connecting device may include fifth and sixth magnetic bodies 735 and 736 and a third stopping device (not illustrated). The third stopping device may be configured to be the same as the first stopping device illustrated in FIGS. 6A to 6C.

Figure 8A:
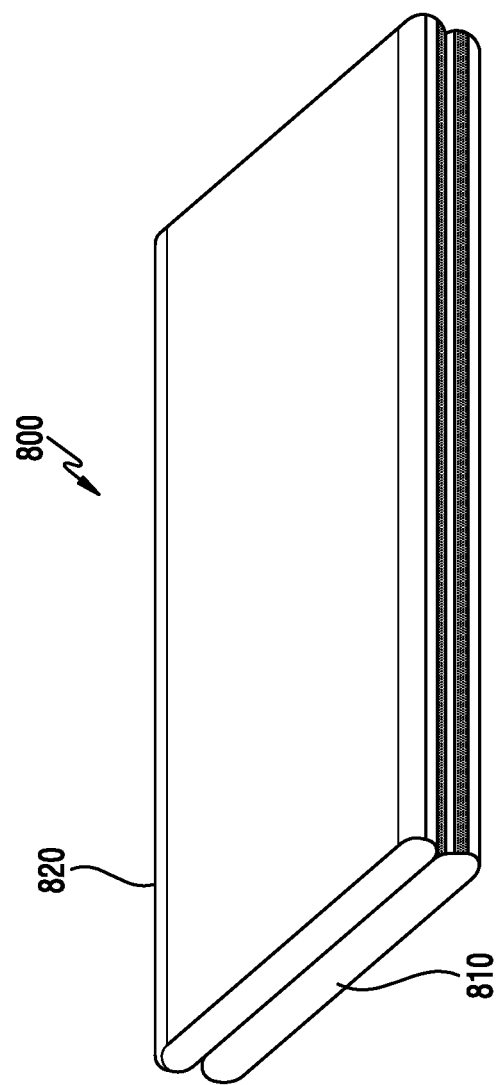
FIG. 8A is a perspective view illustrating an electronic device according to various embodiments of the present disclosure in the closed state (in-folded angle)
Figure 8B:
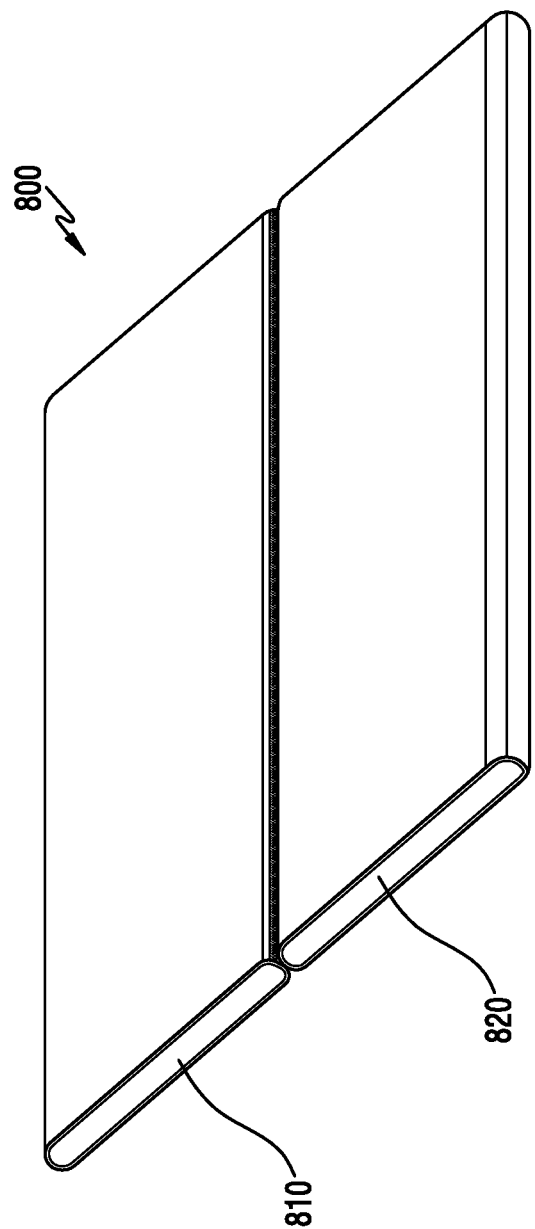
FIG. 8B is a perspective view illustrating the electronic device according to various embodiments of the present disclosure in the opened state (open angle)
Figure 8C:
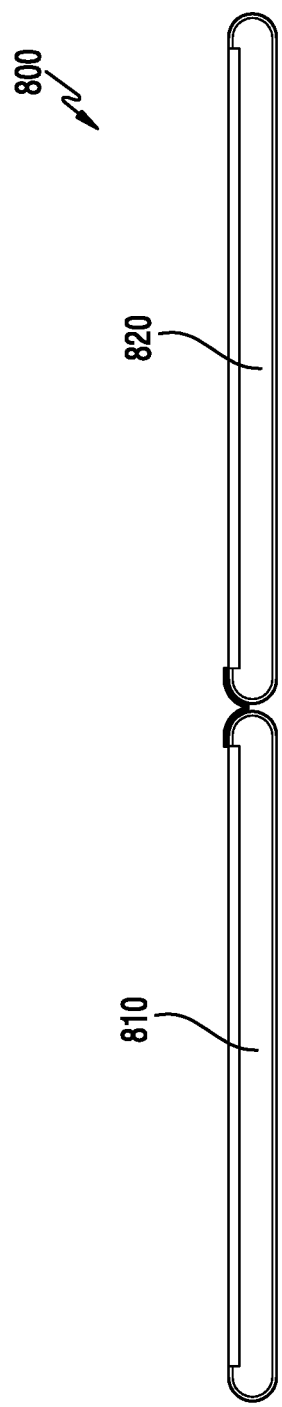
FIG. 8C is a front view illustrating the electronic device according to various embodiments of the present disclosure in the opened state (open angle)

Referring to FIGS. 8A to 8C, an electronic device 800 according to various embodiments may be at least partially the same as the electronic device 100 illustrated in FIGS. 1A to 1C. The electronic device 800 according to various embodiments has some components which are the same as those of the electronic device 100 illustrated in FIGS. 1A to 1C. Thus, detailed descriptions of the same components will be omitted, and only the difference therebetween will be described.

The electronic device 800 according to various embodiments may include first and second housings 810 and 820, a connecting device that connects the first and second housings 810 and 820 to each other, and a stopping device that stops the second housing 820 with respect to the first housing 810. Since the first and second housings 810 and 820 illustrated in FIGS. 8A to 8C are the same as the first and second housings 110 and 120 illustrated in FIGS. 1A to 1C, respectively, a detailed description thereof may be omitted.

Referring to FIGS. 9A to 10C, in the electronic device according to various embodiments, the first and second housings, which are independent from each other, may be connected to each other as a single body using a magnetic force.

For example, the electronic device may be configured to be cradled at various angles using a magnetic force and a stopping device. As various angular embodiments, the electronic device may be cradled at a folding angle (closed angle), an out-folded angle, an un-folded angle (open angle), an inclined cradling angle, and the like.

Figure 9A:
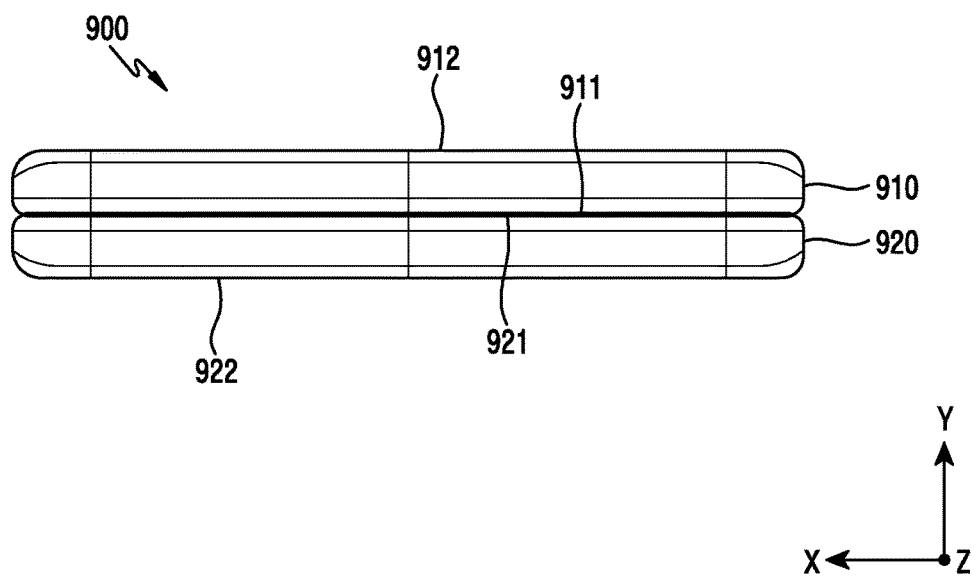
FIG. 9A is a front view illustrating the electronic device according to various embodiments of the present disclosure at an in-folded angle.

Referring to FIG. 9A, an electronic device 900 according to various embodiments may be at least partially or wholly the same as the electronic device 800 illustrated in FIGS. 8A to 8C. The electronic device 900 according to various embodiments may be configured such that the first and second housings 910 and 920 are disposed in a folded state at an in-folded angle, the first cover 911 of the first housing 910 may face the third cover 921 of the second housing 920, and the second cover 912 of the first housing 910 may be opposed to the fourth cover 922 of the second housing 920.

Figure 9B:
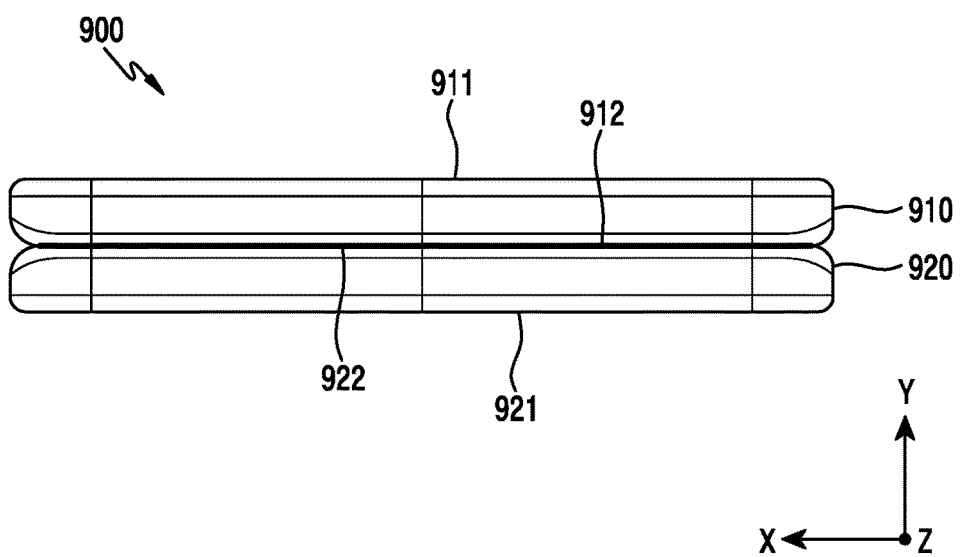
FIG. 9B is a front view illustrating the electronic device according to various embodiments of the present disclosure at an out-folded angle.

Referring to FIG. 9B, the electronic device 900 according to various embodiments may be configured such that the first and second housings 910 and 920 are disposed in a folded state at an out-folded angle, the second cover 912 of the first housing 910 may face the fourth cover 922 of the second housing 920, and the first cover 911 of the first housing 910 may be opposed to the third cover 921 of the second housing 920.

Figure 10A:
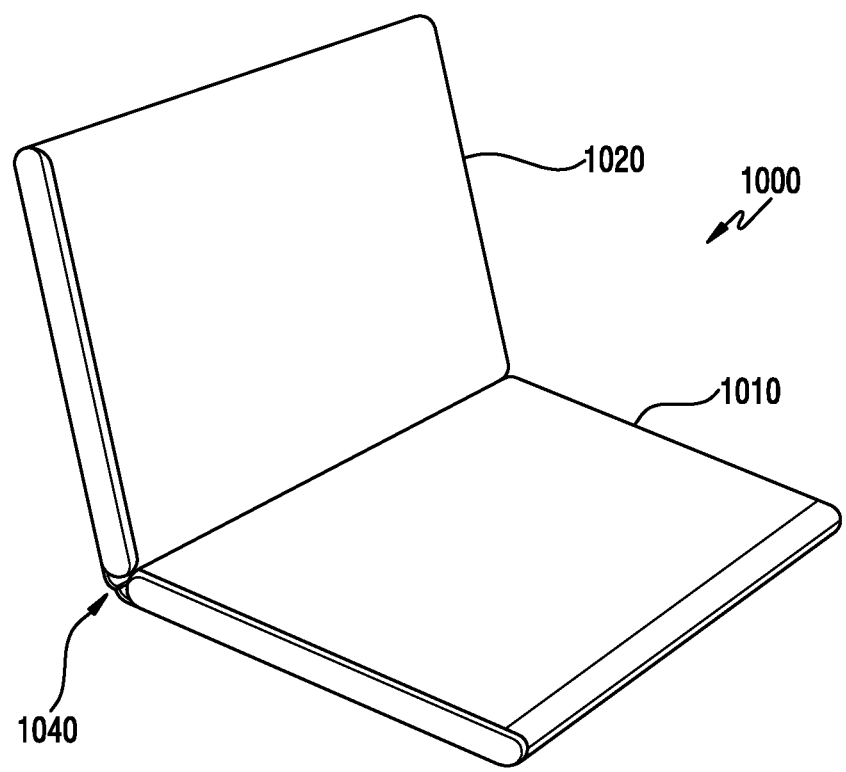
FIG. 10A is a perspective view illustrating the electronic according to various embodiments of the present disclosure device at a first cradling angle in an inclined state.

Referring to FIG. 10A, an electronic device 1000 according to various embodiments may be at least partially or wholly the same as the electronic device 800 illustrated in FIGS. 8A to 8C. The electronic device 1000 according to various embodiments may be obliquely supported by the second housing 1020 at an angle between approximately 100 and 120 degrees with respect to the first housing 1010 and may be maintained in the supported state. The second housing 1020 may be kept inclined to the first housing 1010 by the magnetic force of a magnetic body and a stopping device serving as a stopper.

Figure 10B:
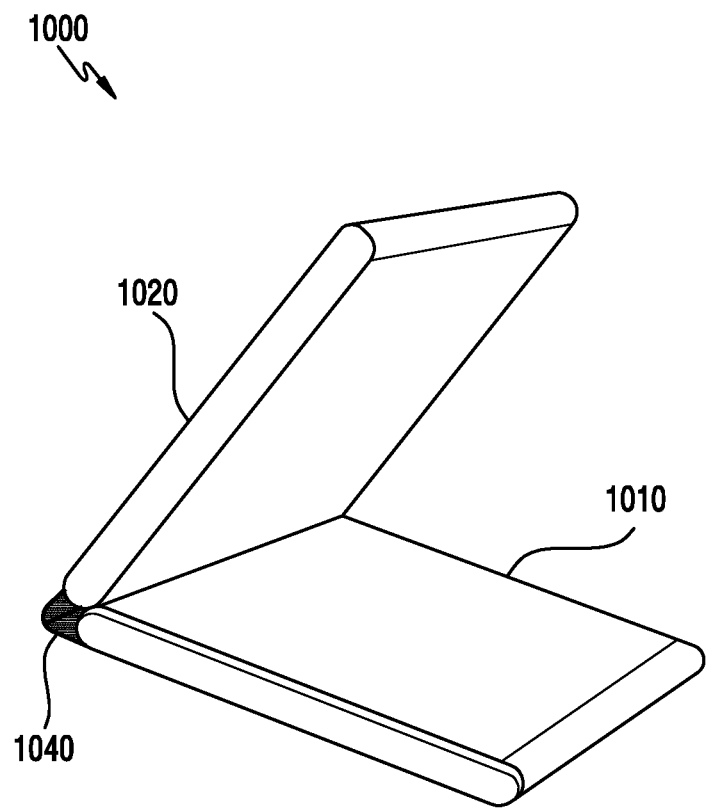
FIG. 10B is a perspective view illustrating the electronic device according to various embodiments of the present disclosure at a second cradling angle in an inclined state.
Figure 10C:
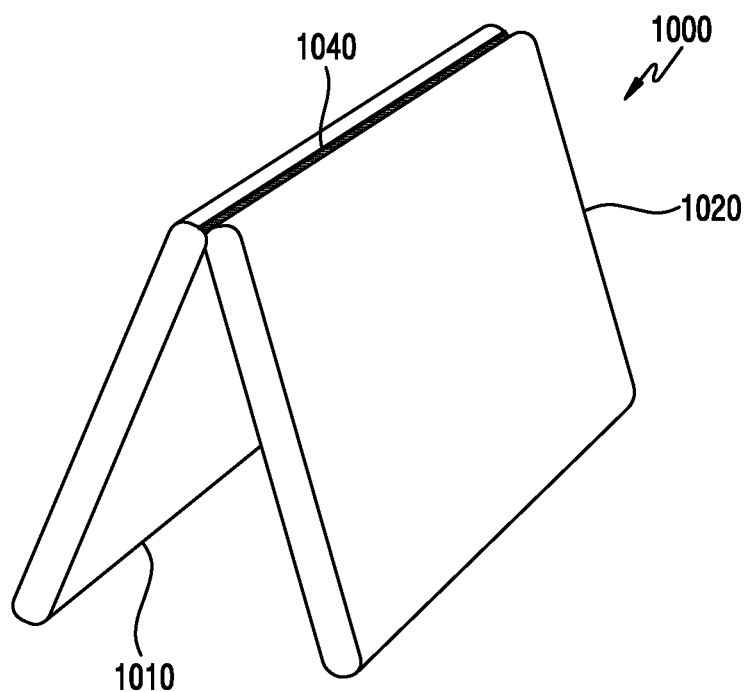
FIG. 10C is a perspective view illustrating the electronic device according to various embodiments of the present disclosure at a second cradling angle in an inclined state.
Figure 11A:
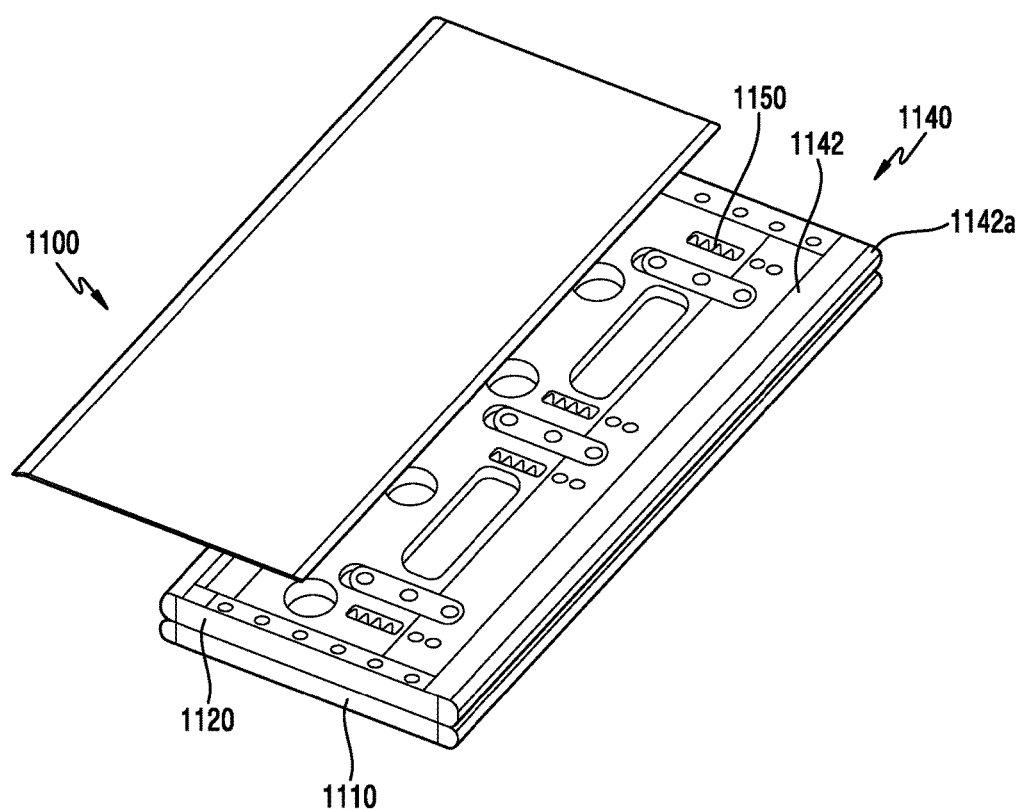
FIG. 11A is a perspective view illustrating a portion of a disposed state of a connecting device and a stopping device mounted on the electronic device according to various embodiments of the present disclosure.
Figure 11B:
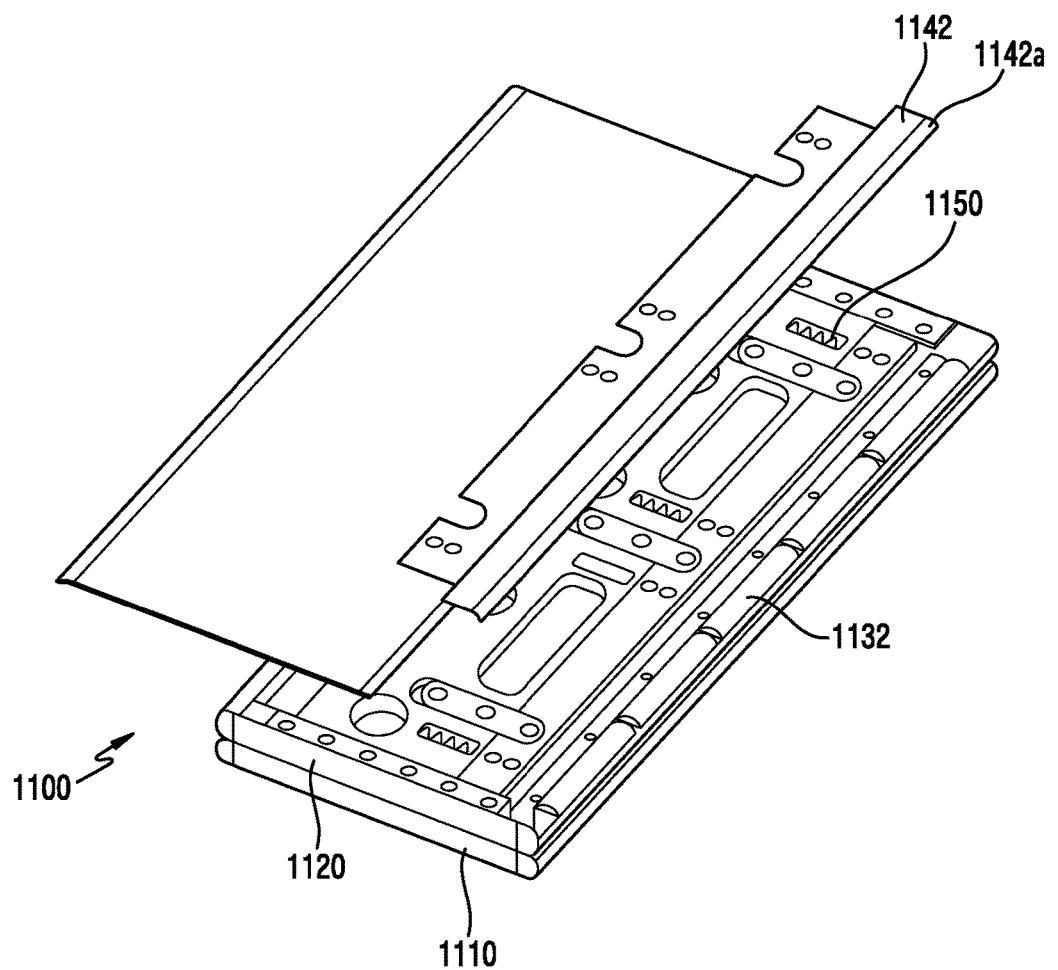
FIG. 11B is an exploded perspective view illustrating the connecting device and the stopping device mounted on the electronic device according to various embodiments of the present disclosure.
Figure 11C:
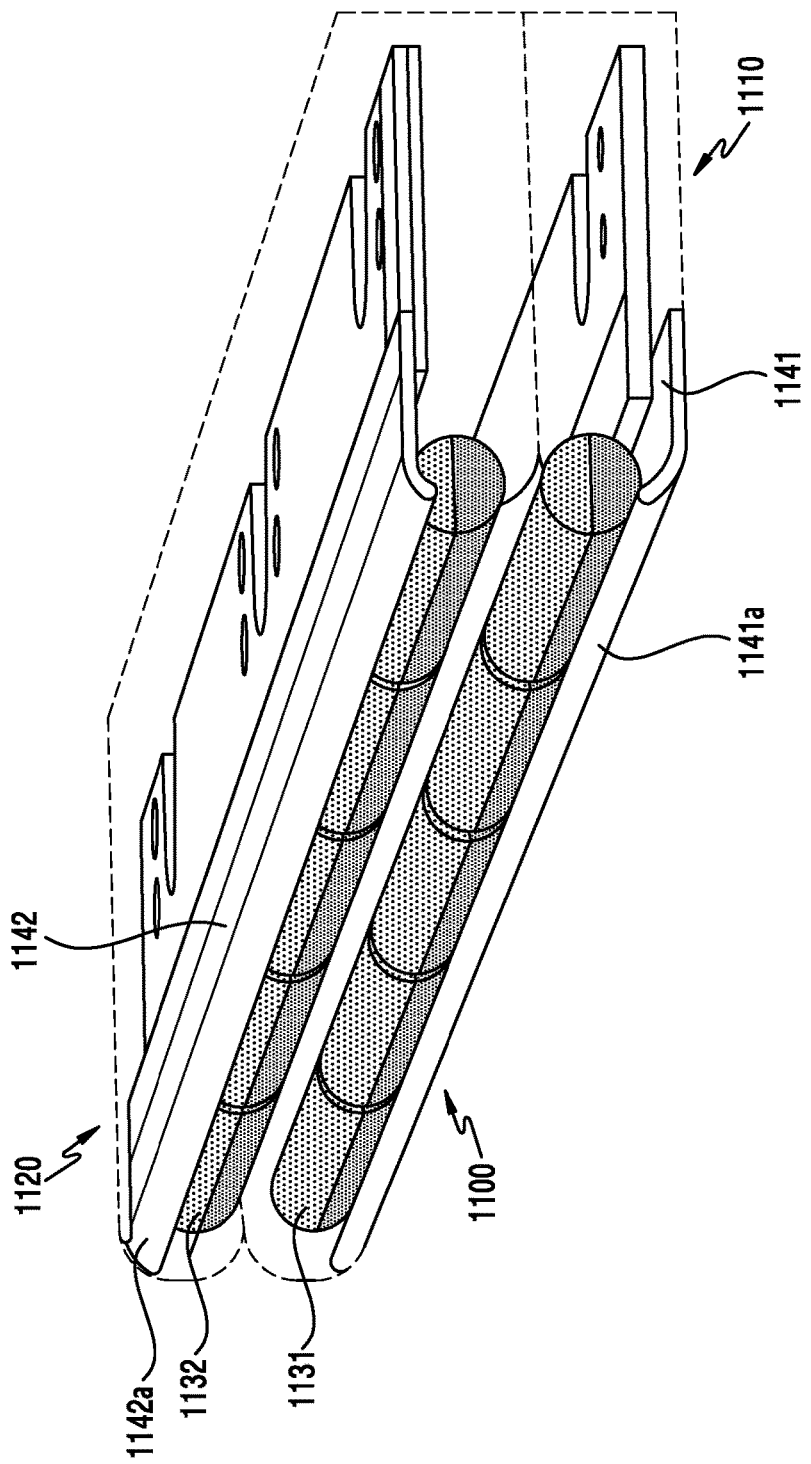
FIG. 11C is a perspective view illustrating the connecting device and the sliding device mounted on the electronic device according to various embodiments of the present disclosure.
Figure 11D:
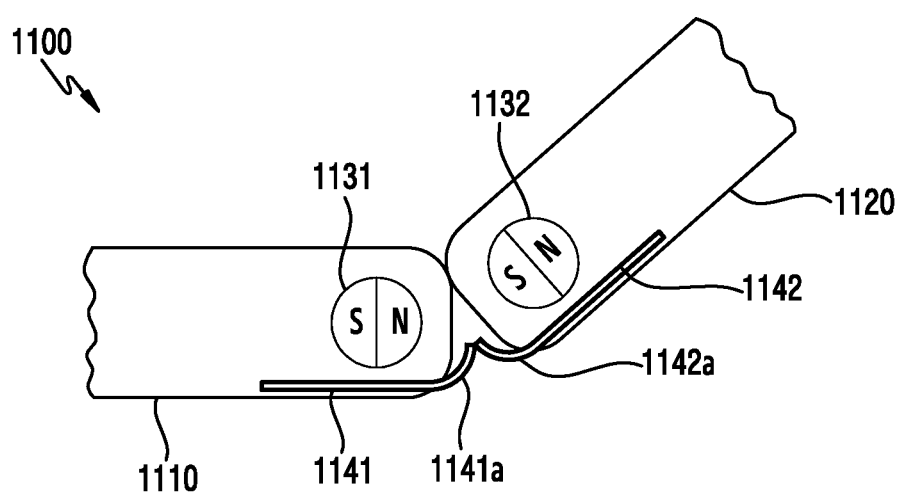
FIG. 11D is a side view illustrating a stopping structure of first and second sliding members mounted on the electronic device according to various embodiments of the present disclosure.

Referring to FIGS. 10B and 10C, the electronic device 1000 according to various embodiments may be obliquely supported by the second housing 1020 at an angle between approximately 45 and 75 degrees with respect to the first housing 1010 and may be maintained in the supported state. The second housing 1020 may be kept inclined to the first housing 1010 by the magnetic force of the magnetic bodies and the stopping device 1040 serving as a stopper.

Referring to FIGS. 11A to 11D, an electronic device 1100 according to various embodiments may be at least partially the same as the electronic device 100 illustrated in FIGS. 8A to 8C. The connecting devices provided in the electronic device 1100 according to various embodiments may include first and second magnetic bodies 1131 and 1132 that are attracted to each other. According to various embodiments, one or more first magnetic bodies 1131 may be disposed at regular intervals along an edge portion of the first housing 1110 and one or more second magnetic bodies 1132 may be disposed at regular intervals along the edge portion of the second housing 1120 and at positions corresponding to the first magnetic bodies 1131. However, the first magnetic bodies and the second magnetic bodies may not be disposed at regular intervals, and may be disposed to face each other.

The second magnetic bodies 1132 generate a magnetic force (e.g., an attractive force) with the first magnetic bodies 1131, so that the first and second housings 1110 and 1120 can be connected to each other at various angles. The first magnetic bodies 1131 and the second magnetic bodies 1132 may be configured N-pole magnetic bodies and S-pole magnetic bodies, respectively. In addition, each of the first and second magnetic bodies 1131, 1132 may have a cylindrical shape, but is not limited thereto. For example, the first magnetic bodies 1131 may have a polygonal columnar shape such as a square column or a pentagonal column.

The electronic device 1100 according to various embodiments may include a first sliding member 1141 disposed in the first housing 1110 and a second sliding member 1142 disposed in the second housing 1120. The first sliding member 1141 may be mounted along one first edge portion of the first housing 1110 such that at least a portion of the first sliding member 1141 is exposed in the outer surface of the first edge portion of the first housing 1110.

The second sliding member 1142 according to various embodiments may be mounted along one second edge portion of the second housing 1120 such that at least a portion of the second sliding member 1142 is exposed in the outer surface of the second edge portion of the second housing 1120.

The first sliding member 1141 according to various embodiments may have a first exposed face 1141*a* and may be elastically supported so as to be movable in parallel between first and second covers of the first housing 1110. The second sliding member 1142 according to various embodiments may have a second exposed face 1142*a* and may be elastically supported so as to be movable in parallel between third and fourth covers of the first housing 1120. The first sliding member 1141 may be supported by at least one elastic body 1150 to move toward the inside of the first housing 1110 and the second sliding member 1142 may be supported by the at least one elastic body 1150 to move toward the inside of the second housing 1120.

Since the electronic device 1100 according to various embodiments is configured such that, when the second housing 1120 is obliquely cradled to the first housing 110, the first exposed face 1141*a* protrudes from the edge portion of the first housing 1110 to be in contact with the second exposed face 1142*a* and the second exposed face 1142*a* protrudes from the edge portion of the second housing 1120 to be in contact with the first exposed face 1141*a*, the contact between the first and second protrusions 1141*a* and 1142*a* is able to serve as a stopper of the second housing 1120.

The electronic device 1100 according to various embodiments may be configured such that when the second housing 1120 is in the in-folded or out-folded angle to the first housing 1110, the first exposed surface 1141*a* is accommodated in the first housing 1110 without being in contact with the second exposed face 1142*a* by the first elastic body 1150, thereby being disposed to be flush with the surface of an edge portion of the first housing 1110, and the second exposed face 1142*a* is accommodated in the second housing 1110 without being in contact with the first exposed face 1141*a* by the second elastic body 1150, thereby being disposed to be flush with the surface of an edge portion of the second housing 1120.

The first exposed face 1141*a* according to various embodiments is configured as a first curved face and may be disposed to be in contact with at least a portion of the first magnetic body 1131, and the second exposed face 1142*a* is configured as a second curved surface and may be disposed to be in contact with at least a portion of the second magnetic body 1132. The first curved face may be configured with or without a curvature. The second curved face may be configured with or without a curvature. The first and second curved faces may have the same or different curvatures.

The inner face of the first exposed face 1141*a* may be in contact with at least a portion of the outer circumferential face of the first magnetic body 1131. The inner face of the second exposed face 1142*a* may be in contact with at least a portion of the outer circumferential face of the second magnetic body 1132. Since the first curved face is made of a metal material, the first curved face and the first magnetic body 1131 may be kept in contact with each other by the attractive force acting therebetween, and since the second curved face is also made of a metal material, the contact state may be kept in contact with each other by the attractive force acting therebetween.

When the second housing 1120 is in the state of being obliquely connected to the first housing 1110, the attractive force between the first and second exposed faces 1141*a* and 1142*a* is greater than the attractive force between the first exposed face 1141*a* and the first magnetic body 1131 and greater than the attractive force between the second exposed face 1142*a* and the second magnetic body 1132. Thus, the first and second exposed faces 1141*a* and 1142*a* is able to move in a direction approaching each other and then come in contact with each other so that the inclined state of the second housing 1120 can be stopped.

Meanwhile, the exemplary embodiments disclosed in the specification and drawings are merely presented to easily describe the technical contents of the present disclosure and help with the understanding of the present disclosure and are not intended to limit the scope of the present disclosure. Therefore, all changes or modifications derived from the technical idea of the present disclosure as well as the embodiments described herein should be interpreted to belong to the scope of the present disclosure.

What is claimed is:

1. An electronic device comprising:
 a first housing having a first cover disposed in a first direction and a second cover disposed in a second direction opposite the first direction;
 a second housing having a third cover disposed in a third direction and a fourth cover disposed in a fourth direction opposite the third direction;
 at least one first magnetic body forming a portion of the first housing;
 at least one second magnetic body forming a portion of the second housing, and configured to apply a force for maintaining a rotatably connected state of the second housing to the first housing using a magnetic force with the first magnetic body;
 a first sliding member forming a portion of the first housing, and
 a second sliding member forming a portion of the second housing to face the first sliding member such that the second housing is configured to be obliquely cradled to the first housing by being in contact with the first sliding member.

2. The electronic device of claim 1, wherein the first housing has a plurality of first edge portions, the at least one first magnetic body being disposed along one first edge portion, and
 the second housing has a plurality of second edge portions, the at least one second magnetic body being disposed along one second edge portion.

3. The electronic device of claim 2, wherein the at least one first magnetic bodies and the at least one second magnetic bodies are arranged at regular intervals, respectively, and are disposed to correspond to each other.

4. The electronic device of claim 2, further comprising: a first sliding member disposed between the at least one first magnetic bodies, and a second sliding member disposed between the at least one second magnetic bodies, wherein the first and second sliding members are disposed at positions corresponding to each other.

5. The electronic device of claim 2, wherein each of the at least one first and the at least one second magnetic bodies is formed in a cylindrical shape.

6. The electronic device of claim 2, wherein the first sliding member further includes a third magnetic body and the second sliding member further includes a fourth magnetic body facing the third magnetic body, and
 an attractive force between the third and fourth magnetic bodies provides a force for maintaining an in-folded or out-folded state of the first and second housings.

7. The electronic device of claim 2, wherein the first sliding member is made of a metal material, and includes a first protrusion, which is disposed to be exposed to at least a portion of a side face of a first edge portion of the first housing and is elastically supported to be movable between first and second faces of the first housing, the second sliding member is made of a metal material, and includes a second protrusion, which is disposed to be exposed to at least a portion of a side face of a second edge portion of the second housing and is elastically supported to be movable between third and fourth faces of the second housing, and the second housing is obliquely cradled to the first housing by contact between the first and second protrusions.

8. The electronic device of claim 1, wherein the first sliding member is supported by at least one first elastic body to move inward from the outside of the first housing, and the second sliding member is supported by at least one second elastic body to move inward from the outside of the second housing.

9. The electronic device of claim 1, wherein when the second housing is obliquely cradled to the first housing, a first protrusion protrudes from the first housing and comes into contact with a second protrusion, and the second protrusion protrudes from the second housing and comes into contact with the first protrusion, so that the first and second protrusions serve as stoppers for the second housing.

10. The electronic device of claim 9, wherein when the second housing is at an in-folded or out-folded angle with respect to the first housing, the first protrusion is accommodated in the first housing without being in contact with the second protrusion by a first elastic body so as not to protrude, and the second protrusion is accommodated in the second housing without being in contact with the first protrusion by a second elastic body so as not to protrude.

11. The electronic device of claim 1, wherein the first housing has a first display disposed on the first cover, and the second housing has a second display disposed on the third cover such that the first and second displays face each other in an in-folded state of the electronic device.

12. The electronic device of claim 1, wherein the first direction is the same as the third direction and the second direction is the same as the fourth direction.

13. An electronic device comprising:
a first housing having a first cover disposed in a first direction and a second cover disposed in a second direction opposite the first direction;
a second housing having a third cover disposed in a third direction and a fourth cover disposed in a fourth direction opposite the third direction;
one or more first magnetic bodies disposed along an edge portion of the first housing,
one or more second magnetic bodies disposed along an edge portion of the second housing and configured to apply a force for maintaining a rotatably connected state of the second housing to the first housing using a magnetic force with the first magnetic bodies;
a first sliding member mounted along the edge portion of the first housing and disposed such that at least a portion of the first sliding member is exposed to the outside at the edge portion of the first housing, and
a second sliding member mounted along an edge portion of the second housing and disposed such that at least a portion of the second sliding member is exposed at the edge portion of the second housing and faces the first sliding member, wherein the second sliding member allows the second housing to be obliquely cradled to the first housing by being in contact with the first sliding member.

14. The electronic device of claim 13, wherein the first sliding member has a first exposed face, and is elastically supported so as to be movable in parallel between the first and second covers of the first housing, the second sliding member has a second exposed face, and is elastically supported so as to be movable in parallel between the third and fourth covers of the second housing, and the second housing is obliquely fixed to the first housing by the contact between the first and second exposed faces.

15. The electronic device of claim 14, wherein the first sliding member is supported by at least one first elastic body to move inward of the first housing, and the second sliding member is supported by at least one second elastic body to move inward of the second housing.

16. The electronic device of claim 15, wherein when the second housing is obliquely cradled to the first housing, the first exposed face protrudes from an edge portion of the first housing and comes into contact with the second exposed face, and the second exposed face protrudes from an edge portion of the second housing and comes into contact with the first exposed face, so that contact between the first and second exposed faces serves as a stopper for the second housing.

17. The electronic device of claim 15, wherein when the second housing is at an in-folded or out-folded angle with respect to the first housing, the first exposed face is accommodated in the first housing without being in contact with the second exposed face by the first elastic body so as to be flush with a surface of the edge portion of the first housing, and the second exposed face is accommodated in the second housing without being in contact with the first exposed face by the second elastic body so as to be flush with a surface of the edge portion of the second housing.

18. The electronic device of claim 14, wherein the first exposed face is formed in a first curved face and is disposed to be in contact with at least a portion of the first magnetic body, and the second exposed face is formed in a second curved face and is disposed to be in contact with at least a portion of the second magnetic body.

19. The electronic device of claim 13, wherein the first magnetic bodies are disposed at regular intervals along the edge portion of the first housing, the second magnetic bodies are arranged at regular intervals along the edge portion of the second housing and are disposed at positions corresponding to the first magnetic bodies, and an attractive force acts between the first and second magnetic bodies.

20. The electronic device of claim 13, wherein each of the first and second magnetic bodies is formed in a cylindrical shape.

21. The electronic device of claim 13, wherein the first housing has a first display disposed on the first cover, and the second housing has a second display disposed on the third cover such that the first and second displays face each other in an in-folded state of the electronic device.

* * * * *